US012740197B2

(12) United States Patent
Kim et al.

(10) Patent No.: US 12,740,197 B2
(45) Date of Patent: Sep. 15, 2026

(54) DISPLAY DEVICE

(71) Applicant: Samsung Display Co., LTD., Yongin-si (KR)

(72) Inventors: Hyeong Seok Kim, Yongin-si (KR); Jang Mi Kang, Yongin-si (KR); Jun Hyun Park, Yongin-si (KR); Min Jae Jeong, Yongin-si (KR); Mu Kyung Jeon, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 450 days.

(21) Appl. No.: 18/116,425

(22) Filed: Mar. 2, 2023

(65) Prior Publication Data

US 2023/0352627 A1 Nov. 2, 2023

(30) Foreign Application Priority Data

May 2, 2022 (KR) ........................ 10-2022-0054198

(51) Int. Cl.

*H10H 20/831* (2025.01)
*G06F 1/16* (2006.01)
*H04M 1/02* (2006.01)
*H10H 20/857* (2025.01)

(52) U.S. Cl.

CPC ....... *H10H 20/8312* (2025.01); *G06F 1/1616* (2013.01); *H04M 1/0216* (2013.01); *H10H 20/857* (2025.01)

(58) Field of Classification Search

CPC ............. H10H 20/8312; H10H 20/857; H10H 29/142; G06F 1/1616; G06F 1/1637; G06F 1/1652; H04M 1/0216; H04M 1/0214; H04M 1/0268; H04M 1/0266; H10D 86/423; H10D 86/481; H10D 86/60; H10K 59/1213; H10K 59/1216; H10K 59/123; H10K 59/124; H10K 59/131; H10K 50/813

See application file for complete search history.

(56) References Cited

U.S. PATENT DOCUMENTS 10,763,451 B2 * 9/2020 Lius ....................... H10K 10/46
2008/0079005 A1 * 4/2008 Tseng .................. H10D 86/481
345/82

(Continued)

FOREIGN PATENT DOCUMENTS

KR 10-0560780 3/2006
KR 10-2018-0112158 10/2018

(Continued)

*Primary Examiner* — Bitew A Dinke
(74) *Attorney, Agent, or Firm* — F. CHAU & ASSOCIATES, LLC

(57) ABSTRACT

A display device including a substrate, a first semiconductor layer disposed on the substrate, a first gate electrode disposed on the first semiconductor layer, a first storage electrode overlapping at least a portion of the first gate electrode and forming a first capacitor with the first gate electrode, and a first electrode disposed on the first storage electrode and forming a second capacitor together with the first storage electrode. The first storage electrode includes a first opening, the first electrode includes a second opening, and the first opening and the second opening overlap each other.

20 Claims, 20 Drawing Sheets

(56) References Cited

U.S. PATENT DOCUMENTS

| | | | | |
|---|---|---|---|---|
| 2014/0225075 | A1* | 8/2014 | Zhan | H10D 30/6745 257/66 |
| 2017/0011685 | A1* | 1/2017 | Jeon | G09G 3/3233 |
| 2017/0053975 | A1* | 2/2017 | Cho | H10D 86/60 |
| 2017/0317155 | A1* | 11/2017 | Oh | H10D 86/60 |
| 2018/0286307 | A1* | 10/2018 | Kim | G09G 3/3283 |
| 2019/0148477 | A1* | 5/2019 | Park | H10K 59/1213 257/40 |
| 2019/0164491 | A1* | 5/2019 | Kim | H10K 59/131 |
| 2019/0393291 | A1* | 12/2019 | Jeon | G09G 3/3233 |
| 2020/0083309 | A1* | 3/2020 | Wang | H10D 30/6723 |
| 2020/0135831 | A1* | 4/2020 | Bae | H10K 59/126 |
| 2020/0227500 | A1* | 7/2020 | Chen | H10K 59/1213 |
| 2020/0265782 | A1* | 8/2020 | Kim | H10D 86/60 |
| 2020/0312924 | A1* | 10/2020 | Choi | H10D 86/60 |
| 2021/0043707 | A1* | 2/2021 | Park | H10K 59/1213 |
| 2021/0057506 | A1* | 2/2021 | Jo | G09G 3/3233 |
| 2021/0193780 | A1* | 6/2021 | Diao | H10K 59/1201 |
| 2021/0242249 | A1* | 8/2021 | Baek | H10D 86/431 |
| 2021/0249498 | A1* | 8/2021 | Cho | H10D 86/481 |
| 2021/0296367 | A1* | 9/2021 | Seo | H10D 86/0223 |
| 2021/0359063 | A1* | 11/2021 | Lu | H10D 86/481 |
| 2022/0199726 | A1* | 6/2022 | Matsueda | H10K 59/131 |
| 2023/0060545 | A1* | 3/2023 | Du | G09G 3/3241 |
| 2023/0061191 | A1* | 3/2023 | Oh | G09G 3/3266 |
| 2024/0138188 | A1* | 4/2024 | Kim | H10K 59/1213 |
| 2024/0304144 | A1* | 9/2024 | Sano | G09G 3/3291 |

FOREIGN PATENT DOCUMENTS

| | | |
|---|---|---|
| KR | 10-2019-0010058 | 1/2019 |
| KR | 10-2019-0056465 | 5/2019 |

* cited by examiner

ACM3
1138
ACM2
1139
ACM1
1134
1134
154
1132
T2
151
BML2
1135
T5
152
ACM4
ACM5
129
T8
T9
T4
T3
1133
1155
ACM6
BML1
1151
1153
1131
T1
1152
1155a
1155b
ACM7
ACM8
ACM9
T6
155
1136
ACM10
154
127a
1156
T7
1137

DISPLAY DEVICE

CROSS-REFERENCE TO RELATED APPLICATION(S)

This application claims priority to and benefits of Korean Patent Application No. 10-2022-0054198 under 35 U.S.C. § 119, filed on May 2, 2022 in the Korean Intellectual Property Office, the entire contents of which are incorporated herein by reference.

BACKGROUND

1. Technical Field

The disclosure relates to a display device.

2. Description of the Related Art

A display device serves to display a screen, and may be embodied as a liquid crystal display, an organic light emitting diode display, or the like. Such a display device may be used in various electronic devices such as mobile phones, navigation units, digital cameras, electronic books, portable game machines, and various terminals.

A display device such as an organic light emitting diode display may have a structure in which the display device can be bent or folded using a flexible substrate.

The above information disclosed in this Background section is only for enhancement of understanding of the background of the disclosure, and therefore, it may contain information that does not form the prior art that is already known in this country to a person of ordinary skill in the art.

SUMMARY

Embodiments have been made in an effort to provide a display device having improved display quality and reliability by providing a dehydrogenation path discharged from a semiconductor layer. Embodiments have been made in an effort to provide a high-resolution display device.

An embodiment provides a display device that may include a substrate, a first semiconductor layer disposed on the substrate, a first gate electrode disposed on the first semiconductor layer, a first storage electrode overlapping at least a portion of the first gate electrode and forming a first capacitor with the first gate electrode, and a first electrode disposed on the first storage electrode and forming a second capacitor together with the first storage electrode. The first storage electrode may include a first opening, the first electrode may include a second opening, and the first opening and the second opening may overlap each other.

The first capacitor may be a storage capacitor, the second capacitor may be a hold capacitor, and the first capacitor and the second capacitor may overlap in a direction that is perpendicular to a surface of the substrate.

The first semiconductor layer may include a first transistor, and the first transistor may overlap at least portions of the first gate electrode, the first storage electrode, and the first electrode.

The first transistor may be a driving transistor.

The first electrode may receive a driving voltage.

A size of the second opening may be greater than a size of the first opening.

The display device may further include a first data conductive layer disposed on the first electrode, and a portion of the first data conductive layer may be electrically connected to the first gate electrode.

The display device may further include a first gate insulating layer disposed between the semiconductor layer and the first gate electrode, a second gate insulating layer disposed between the first gate electrode and the first storage electrode, a first insulating layer disposed between the first storage electrode and the first electrode, and a second insulating layer disposed between the first electrode and the first data conductive layer. A third opening passing through the first opening and the second opening may be formed in the second insulating layer, the first insulating layer, the second gate insulating layer, and the first gate insulating layer.

The display device may further include a second semiconductor layer disposed on the second insulating layer, a third gate conductive layer disposed on the second semiconductor layer, and a second data conductive layer disposed on the first data conductive layer.

The display device may further include second to ninth transistors.

An embodiment provides a display device that may include a substrate, a first transistor disposed on the substrate, a first gate electrode disposed on the first transistor, a first storage electrode overlapping at least a portion of the first gate electrode and forming a first capacitor with the first gate electrode, and a first electrode disposed on the first storage electrode and forming a second capacitor together with the first storage electrode. The first capacitor and the second capacitor may overlap in a direction that is perpendicular to a surface of the substrate, the first storage electrode may include a first opening, the first electrode may include a second opening, and at least portions of the first opening and the second opening may overlap each other.

The first capacitor may be a storage capacitor, and the second capacitor may be a hold capacitor.

The first transistor may be a driving transistor, and the first transistor may overlap the first storage electrode and the first electrode.

The first electrode may receive a driving voltage.

A size of the second opening may be greater than a size of the first opening.

The display device may further include a first data conductive layer disposed on the first electrode, and a portion of the first data conductive layer may be electrically connected to the first gate electrode.

The display device may further include a first gate insulating layer disposed between the first transistor and the first gate electrode, a second gate insulating layer disposed between the first gate electrode and the first storage electrode, a first insulating layer disposed between the first storage electrode and the first electrode, and a second insulating layer disposed between the first electrode and the first data conductive layer. A third opening passing through the first opening and the second opening may be formed in the second insulating layer, the first insulating layer, the second gate insulating layer, and the first gate insulating layer.

The display device may further include a second semiconductor layer disposed on the second insulating layer, a third gate conductive layer disposed on the second semiconductor layer, and a second data conductive layer disposed on the first data conductive layer.

The display device may further include second to ninth transistors.

At least some of the first to ninth transistors may be p-type transistors, and rest of the first to ninth transistors may be n-type transistors.

According to the embodiments, it is possible to provide a display device having improved display quality and reliability by providing a dehydrogenation path discharged from a semiconductor layer. It is also possible to provide a high-resolution display device.

DETAILED DESCRIPTION OF THE EMBODIMENTS

Figure 1:
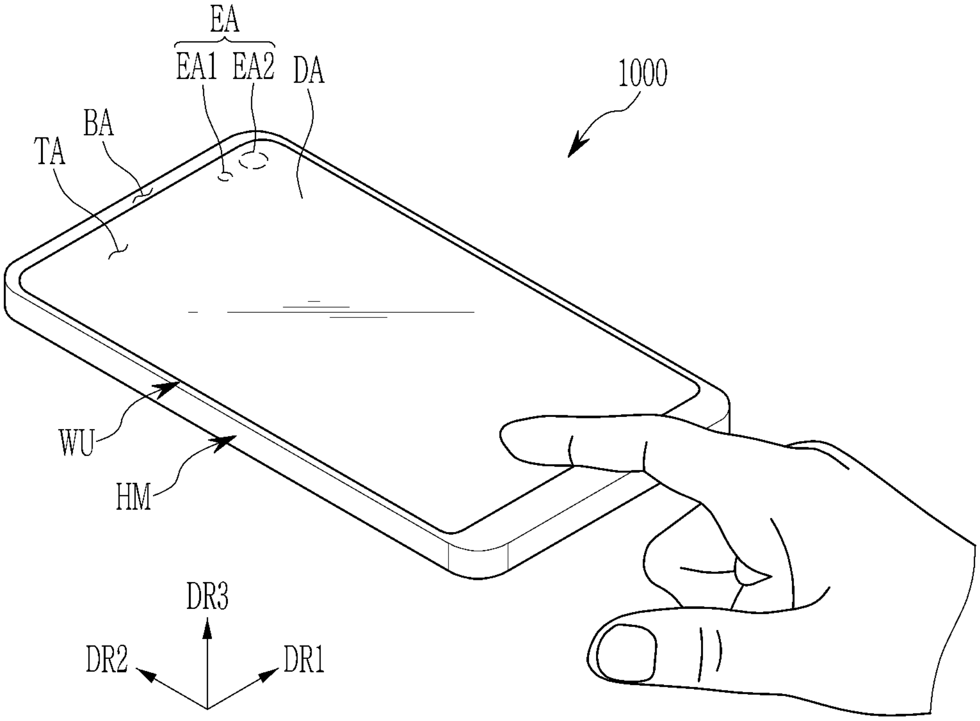
FIG. 1 illustrates a schematic perspective view showing a use state of a display device according to an embodiment.

The disclosure will be described more fully hereinafter with reference to the accompanying drawings, in which embodiments are shown. As those skilled in the art would realize, the described embodiments may be modified in various different ways, all without departing from the spirit or scope of the disclosure.

As used herein, the singular forms, "a," "an," and "the" are intended to include the plural forms as well, unless the context clearly indicates otherwise.

In the specification and the claims, the term "and/or" is intended to include any combination of the terms "and" and "or" for the purpose of its meaning and interpretation. For example, "A and/or B" may be understood to mean any combination including "A, B, or A and B." The terms "and" and "or" may be used in the conjunctive or disjunctive sense and may be understood to be equivalent to "and/or."

In the specification and the claims, the phrase "at least one of" is intended to include the meaning of "at least one selected from the group of" for the purpose of its meaning and interpretation. For example, "at least one of A and B" may be understood to mean any combination including "A, B, or A and B."

To clearly describe the disclosure, parts that are irrelevant to the description are omitted, and like numerals refer to like or similar constituent elements throughout the specification.

Further, since sizes and thicknesses of constituent members shown in the accompanying drawings may be arbitrarily given for better understanding and ease of description, the disclosure is not limited to the illustrated sizes and thicknesses.

It will be understood that when an element such as a layer, film, region, or substrate is referred to as being "on" another element, it can be directly on the other element or intervening elements may also be present. In contrast, when an element is referred to as being "directly on" another element, there may be no intervening elements present. Further, in the specification, the word "on" or "above" means positioned on or below the object portion, and does not necessarily mean positioned on the upper side of the object portion based on a gravitational direction.

The terms "comprises," "comprising," "includes," and/or "including,", "has," "have," and/or "having," and variations thereof when used in this specification, specify the presence of stated features, integers, steps, operations, elements, components, and/or groups thereof, but do not preclude the presence or addition of one or more other features, integers, steps, operations, elements, components, and/or groups thereof.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

When an element is described as "not overlapping" or to "not overlap" another element, this may include that the elements are spaced apart from each other, offset from each other, or set aside from each other or any other suitable term as would be appreciated and understood by those of ordinary skill in the art.

Further, throughout the specification, the phrase "in a plan view" means when an object portion is viewed from above, and the phrase "in a cross-sectional view" means when a cross-section taken by vertically cutting an object portion is viewed from the side.

Unless otherwise defined, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
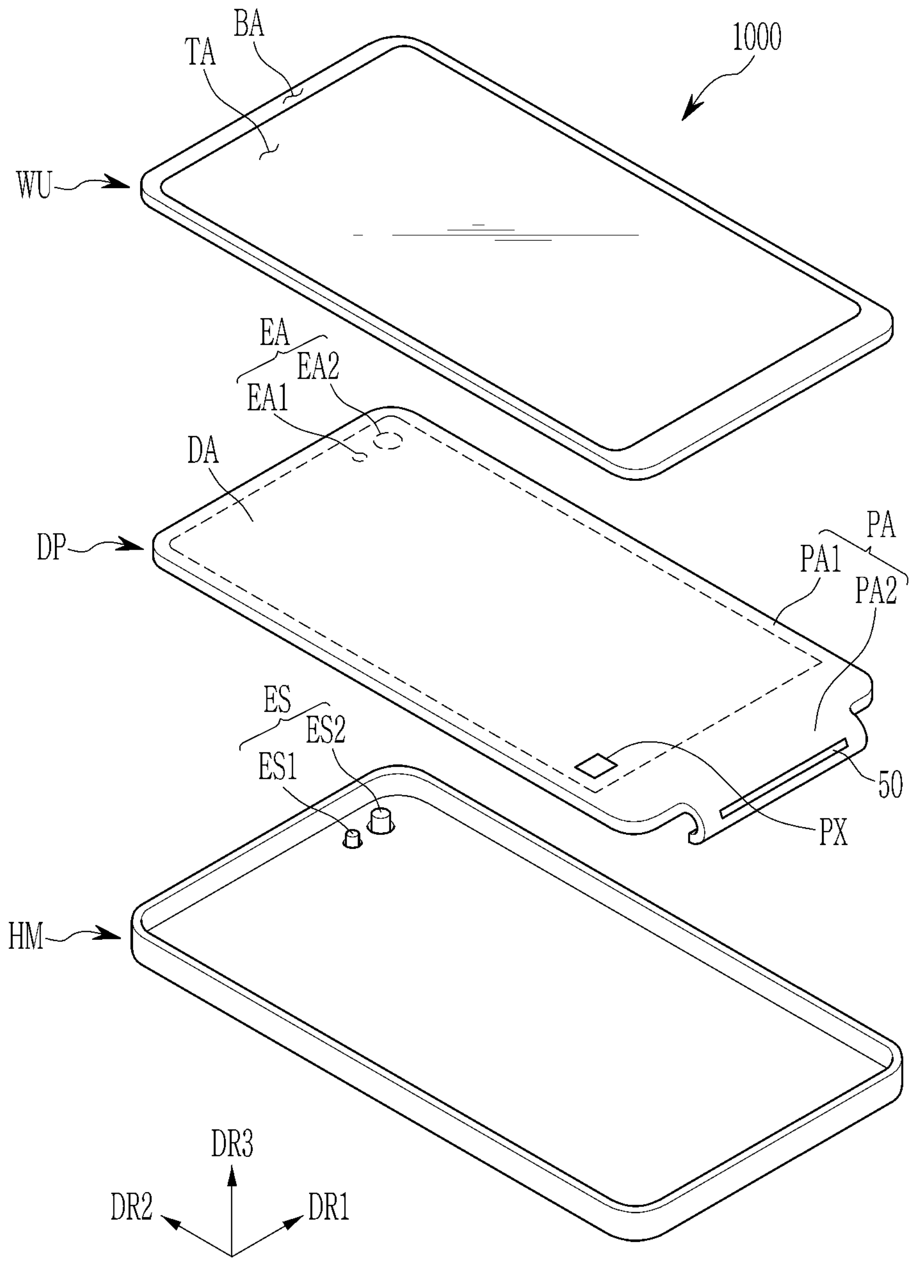
FIG. 2 illustrates an exploded schematic perspective view of a display device according to an embodiment.
Figure 3:
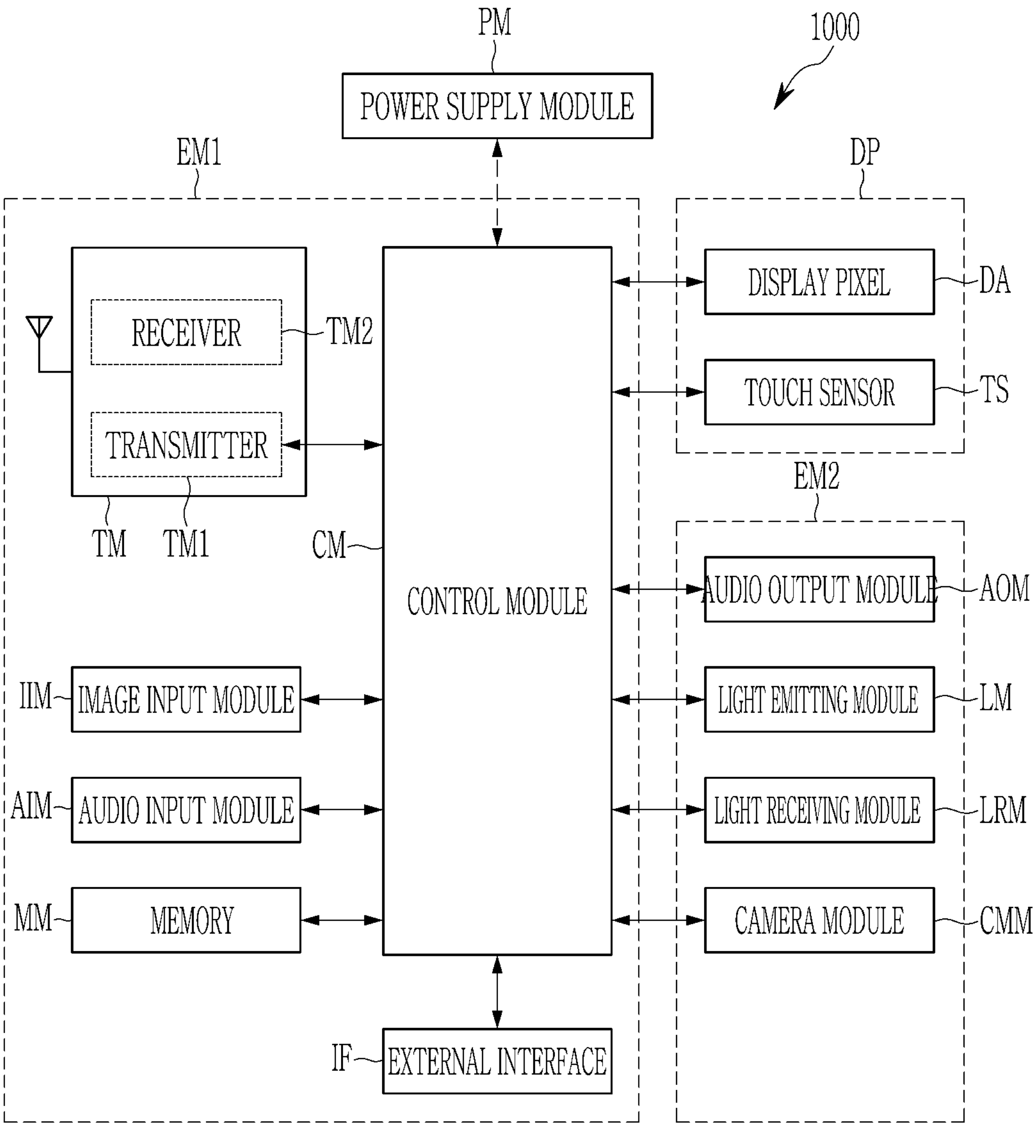
FIG. 3 illustrates a schematic block diagram of a display device according to an embodiment.

Hereinafter, a schematic structure of a display device will be described in detail with reference to FIG. 1 to FIG. 3. FIG. 1 illustrates a schematic perspective view showing a use state of a display device according to an embodiment, FIG. 2 illustrates an exploded schematic perspective view of a display device according to an embodiment, and FIG. 3 illustrates a schematic block diagram of a display device according to an embodiment.

Referring to FIG. 1, the display device 1000 according to an embodiment, which is a device for displaying a moving image or a still image, may be used as a display screen of various products, such as a television, a laptop computer, a monitor, a billboard, an Internet of Things (JOT) device, etc., as well as portable electronic devices such as a mobile phone, a smart phone, a tablet personal computer, a mobile communication terminal, an electronic notebook, an e-book, a portable multimedia player (PMP), a navigation system, and an ultra mobile PC (UMPC). The display device 1000 according to an embodiment may be used in a wearable device such as a smart watch, a watch phone, a glasses display, or a head mounted display (HMD). The display device 1000 according to an embodiment may be used as an instrument panel of a vehicle, a center information display (CID) provided at a center fascia or dashboard of a vehicle, a room mirror display that replaces a side mirror of a vehicle, or a display provided on a back surface of a front seat of a vehicle. FIG. 1 illustrates that the display device 1000 is used as a smart phone for convenience of description.

The display device 100 may display an image in a third direction DR3 on a display surface parallel to each of a first direction DR1 and a second direction DR2. A display surface on which an image may be displayed may correspond to a front surface of the display device 1000, and may correspond to a front surface of a cover window WU. The image may include a still image as well as a dynamic image.

In an embodiment, a front surface (or upper surface) and a rear surface (or lower surface) of each member may be defined based on a direction in which the image may be displayed. The front and rear surfaces may be opposite to each other in the third direction DR3, and a normal direction of each of the front and rear surfaces may be parallel to the third direction DR3. A distance between the front surface and the rear surface in the third direction DR3 may correspond to a thickness of the display panel in the third direction DR3.

The display device 1000 according to an embodiment may sense a user input (refer to a hand of FIG. 1) applied from the outside. The user input may include various types of external inputs, such as a part of a user's body, light, heat, or pressure. In an embodiment, the user input is illustrated as a user hand applied to the front surface. However, the disclosure is not limited thereto. The user input may be provided in various forms, and the display device 1000 may sense the user input applied to the side surface or the rear surface of the display device 1000 depending on a structure of the display device 1000.

Referring to FIG. 1 and FIG. 2, the display device 1000 may include a cover window WU, a housing HM, a display panel DP, and an optical element ES. In an embodiment, the cover window WU and the housing HM may be combined to form an outer appearance of the display device 1000.

The cover window WU may include an insulating panel. For example, the cover window WU may be formed of glass, plastic, or a combination thereof.

A front surface of the cover window WU may define a front surface of the display device 1000. A transmissive area TA may be an optically transparent area. For example, the transmissive area TA may be an area having visible ray transmittance of about 90% or more.

A blocking area BA may define a shape of the transmissive area TA. The blocking area BA may be adjacent to the transmissive area TA, to surround the transmissive area TA. The blocking area BA may be an area having relatively low light transmittance compared to the transmissive area TA. The blocking area BA may include an opaque material that blocks light. The blocking area BA may have a given color. The blocking area BA may be defined by a bezel layer provided separately from a transparent substrate defining the transmissive area TA, or may be defined by an ink layer formed by being inserted or colored in a transparent substrate.

The display panel DP may include a display panel DP that displays an image and a driver 50. The display panel DP may include a front surface including a display area DA and a non-display area PA. The display area DA may be an area in which a pixel operates depending on an electrical signal to emit light.

In an embodiment, the display area DA may be an area in which an image is displayed by including pixels, and at the same time, may be an area where a touch sensor is positioned above the pixel in the third direction DR3 to sense an external input.

A transmissive area TA of the cover window WU may at least partially overlap the display area DA of the display panel DP. For example, the transmissive area TA may overlap an entire surface of the display area DA, or may overlap at least a portion of the display area DA. Accordingly, a user may view an image through the transmission area TA, or may provide an external input based on the image. However, the disclosure is not limited thereto. For example, an area in which an image is displayed and an area in which the external input is sensed may be separated from each other in the display area DA.

The non-display area PA of the display panel DP may at least partially overlap a blocking area BA of the cover window WU. The non-display area PA may be an area covered by a blocking area BA. The non-display area PA may be adjacent to the display area DA, and may surround the display area DA. An image may not be displayed in the non-display area PA, and a driving circuit, a driving wire, and the like for driving the display area DA may be positioned. The non-display area PA may include a first peripheral area PA1 in which the display area DA may be positioned and a second peripheral area PA2 including a driver 50, and a connection wire, and a bending area. In an embodiment of FIG. 2, the first peripheral area PA1 is positioned at three-sides of the display area DA, and the second peripheral area PA2 is positioned at a remaining side of the display area DA.

In an embodiment, the display panel DP may be assembled in a flat state in which the display area DA and the non-display area PA face the cover window WU. However, the disclosure is not limited thereto. A portion of the non-display area PA of the display panel DP may be bent. A portion of the non-display area PA may face the rear surface of the display device 1000, so that the blocking area BA shown on the front surface of the display device 1000 may be reduced, and in FIG. 2, the second peripheral area PA2 may be bent to be positioned on the rear surface of the display area DA, and assembled.

The display panel DP may include a component area EA, and specifically, a first component area EA1 and a second component area EA2. The first component area EA1 and the second component area EA2 may be at least partially surrounded by the display area DA. Although the first component area EA1 and the second component area EA2 are illustrated as being spaced apart from each other, the disclosure is not limited thereto, and at least portions thereof may be connected. The first component area EA1 and the second component area EA2 may each be an area in which a component using infrared rays, visible light, or sound may be positioned therebelow.

The display area DA may include light emitting diodes and pixels that generate and transmit emission currents to the respective light emitting diodes.

The first component area EA1 may include a transmissive portion to allow light to pass therethrough and a second display portion including pixels.

A transmissive portion included in the first component area EA1 may not have a conductive layer or a semiconductor layer, and a pixel defining layer, a light blocking layer, or the like including a light blocking material form an opening so as to not block light. The transmissive portion included in the first component area EA1 represents an area in which a conductive layer or a semiconductor layer may not be positioned between adjacent pixels. The first component area EA1 may include a second display unit including pixels adjacent to the transmissive portion.

The second component area EA2 may include a transmissive portion through which light and/or sound may pass and a display unit including pixels. The transmissive portion may be positioned between adjacent pixels and may be formed to include a transparent layer through which light and/or sound can pass. The display unit may be formed to have a unit structure by combining pixels, and a transmissive portion may be positioned between adjacent unit structures.

Herein, each of the display area DA and the first component area EA may include multiple pixels. A pixel PX may include a light emitting diode and a pixel circuit portion. In the display area DA and the first component area EA, a pixel circuit portion and a light emitting diode may be formed on a one-to-one basis.

Referring to FIG. 1, FIG. 2, and FIG. 3, the display panel DP may include the display area DA including display pixels and a touch sensor TS. The display panel DP may be visually recognized by a user from the outside through the transmissive area TA, including pixels that generate an image. The touch sensor TS may be positioned above the pixels, and may sense an external input applied from the outside. The touch sensor TS may sense the external input provided to the cover window WU.

Again referring to FIG. 2, a second peripheral area PA2 may include a bending portion. The display area DA and the first peripheral area PA1 may have a flat state that is substantially parallel to a plane defined by the first direction DR1 and the second direction DR2, and a first side of the second peripheral area PA2 may extend from the flat state and have the flat state again after going through a bending portion. As a result, at least a portion of the second peripheral area PA2 may be bent and assembled to be positioned on a back side of the display area DA. At least a portion of the second peripheral area PA2 may overlap the display area DA in a plan view once assembled, so that the blocking area BA of the display device 1000 may be reduced. However, the disclosure is not limited thereto. For example, the second peripheral area PA2 may not be bent.

The driver 50 may be mounted on the second peripheral area PA2, and may be mounted on the bending portion or positioned at one of opposite sides of the bending portion. The driver 50 may be provided in the form of a chip.

The driver 50 may be electrically connected to the display area DA to transmit an electrical signal to the display area DA. For example, the driver 50 may provide data signals to the pixels PX positioned in the display area DA. In other embodiments, the driver 50 may include a touch driving circuit, and may be electrically connected to the touch sensor TS positioned in the display area DA. The driver 50 may include various circuits in addition to the above-described circuits, or may be designed to provide various electrical signals to the display area DA.

The display device 1000 may include a pad portion positioned at an end of the second peripheral area PA2, and may be electrically connected to a flexible printed circuit board (FPCB) including a driving chip by means of a pad portion. Herein, the driving chip positioned on the flexible printed circuit board may include various driving circuits for driving the display device 1000, connectors for supplying power, etc. According to an embodiment, a rigid printed circuit board (PCB) may be used instead of the flexible printed circuit board.

An optical element ES may be positioned at a lower portion of the display panel DP. The optical element ES may include a first optical element ES1 overlapping the first component area EA1 and a second optical element ES2 overlapping the second component area EA2.

The first optical element ES1 may be an electronic element using light or sound. For example, the first optical element ES1 may be a sensor that receives and uses light, such as an infrared sensor, a sensor that outputs and detects light or sound to measure a distance or to recognize fingerprints, a small lamp that outputs light, a speaker that outputs sound, or the like. Of course, in the case of an electronic element using light, light of various wavelength bands such as visible light, infrared light, and ultraviolet light may be used.

The second optical element ES2 may be at least one of a camera, an infrared camera, a dot projector, an infrared illuminator, and a time-of-flight sensor.

Referring to FIG. 3, the display device 1000 may include a display panel DP, a power supply module PM, a first electronic module EM1, and a second electronic module EM2. The display panel DP, the power supply module PM, the first electronic module EM1, and the second electronic module EM2 may be electrically connected to each other. In FIG. 3, a display pixel and a touch sensor TS positioned in the display area DA among elements of the display panel DP are illustrated as an example.

The power supply module PM may supply power required for an overall operation of the display device 1000. The power supply module PM may include a conventional battery module.

The first electronic module EM1 and the second electronic module EM2 may include various functional modules for operating the display device 1000. The first electronic module EM1 may be directly mounted on a motherboard that is electrically connected to the display panel DP, or may be mounted on a separate board to be electrically connected to the motherboard through a connector (not illustrated).

The first electronic module EM1 may include a control module CM, a wireless communication module TM, an image input module JIM, an audio input module AIM, a memory MM, and an external interface IF. Some of the modules may not be mounted to a motherboard, but may be electrically connected to the motherboard through a flexible printed circuit board connected thereto.

The control module CM may control the overall operation of the display device 1000. The control module CM may be a microprocessor. For example, the control module CM activates or deactivates the display panel DP. The control module CM may control other modules such as the image input module JIM and the audio input module AIM based on a touch signal received from the display panel DP.

The wireless communication module TM may transmit/receive a wireless signal to/from another terminal using a Bluetooth or Wi-Fi line. The wireless communication module TM may transmit/receive a voice signal using a general communication line. The wireless communication module TM may include a transmitter TM1 that modulates and transmits a signal to be transmitted, and a receiver TM2 that demodulates the received signal.

The image input module JIM may process an image signal, and may convert it into image data that can be displayed on the display panel DP. The sound input module AIM may receive an external sound signal by a microphone in a recording mode, a voice recognition mode, and the like, and may convert it into electrical voice data.

The external interface IF may serve as an interface connected to an external charger, a wired/wireless data port, a card socket (e.g., a memory card, a SIM/UIM card), and the like.

The second electronic module EM2 may include an audio output module (AOM), a light emitting module (LM), a light receiving module (LRM), a camera module (CMM), etc., and at least some of them, which are optical elements ES, may be positioned on the rear surface of the display panel DP as illustrated in FIG. 1 and FIG. 2. The optical element ES may include a light emitting module LM, a light receiving module LRM, and a camera module CMM. The second electronic module EM2 may be mounted directly on the motherboard, may be mounted on a separate board, and may be electrically connected to the display panel DP through a connector (not illustrated) or the like, or may be electrically connected to the first electronic module EM1.

The sound output module AOM may convert sound data received from the wireless communication module TM or sound data stored in the memory MM to output the converted sound data to the outside.

The light emitting module LM may generate and output light. The light emitting module LM may output infrared rays. For example, the light emitting module LM may include an LED element. For example, the light receiving module LRM may sense infrared rays. The light receiving module LRM may be activated in case that infrared rays of a given level or more are sensed. The light receiving module LRM may include a CMOS sensor. After infrared light generated by the light emitting module LM is outputted, it is reflected by an external subject (e.g., a user's finger or face), and the reflected infrared light may be incident on the light receiving module LRM. The camera module CMM may capture an external image.

In an embodiment, the optical element ES may additionally include a photosensitive sensor or a thermal sensor. The optical element ES may sense an external object received through the front surface, or may supply a sound signal such as a voice through the front surface to the outside. The optical element ES may include multiple components, but is not limited to any one embodiment.

Referring to FIG. 2 again, the housing HM may be coupled to the cover window WU. The cover window WU may be positioned on the front surface of the housing HM. The housing HM may be coupled to the cover window WU to provide an accommodation space. The display panel DP and the optical element ES may be accommodated in the accommodation space provided between the housing HM and the cover window WU.

The housing HM may include a material having relatively high rigidity. For example, the housing HM may include frames and/or plates made of glass, plastic, metal, or a combination thereof. The housing HM may stably protect components of the display device 1000 accommodated in an internal space from external impact.

Figure 4:
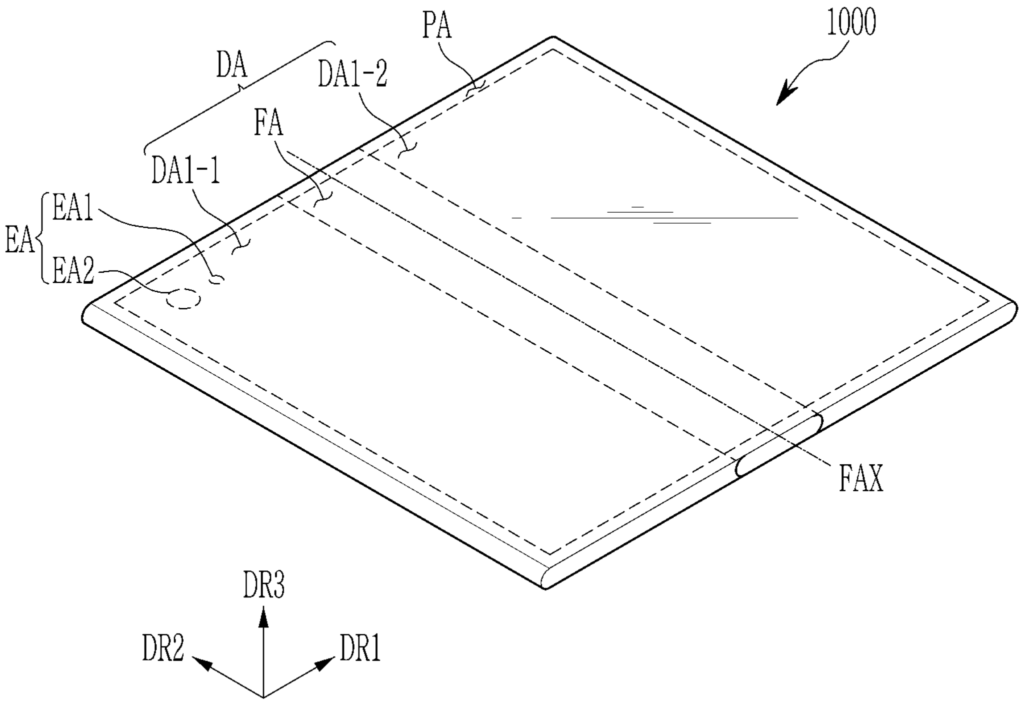
FIG. 4 illustrates a schematic perspective view of a display device according to another embodiment.

Hereinafter, a structure of the display device 1000 according to another embodiment will be described with reference to FIG. 4. FIG. 4 illustrates a schematic perspective view of a display device according to another embodiment. A description of the same or similar constituent elements as those described above will be omitted.

FIG. 4 illustrates a foldable display device having a structure in which the display device 1000 may be folded through a folding line FAX.

Referring to FIG. 4, in an embodiment, the display device 1000 may be a foldable display device. The display device 1000 may be folded outwardly or inwardly based on the folding axis FAX. In case folded outward based on the folding axis FAX, display surfaces of the display device 1000 may be respectively positioned outside in the third direction DR3 to display images in opposite directions. In case folded inward based on the folding axis FAX, the display surfaces may not be visually recognized from the outside.

In an embodiment, the display device 1000 may include a display area DA, a component region EA, and a non-display area PA. The display area DA may be divided into a first-1 display area DA1-1, a first-2 display area DA1-2, and a folding area FA. The first-1 display area DA1-1 and the first-2 display area DA1-2 may be positioned at left and right sides, respectively, with respect to (or at a center) of the folding axis FAX, and the folding area FA may be positioned between the first-1 display area DA1-1 and the first-2 display area DA1-2. In case folded outward based on the folding axis FAX, the first-1 display area DA1-1 and the first-2 display area DA1-2 may be positioned at opposite sides in the third direction DR3, and images may be displayed in both directions. In case folded inward based on the folding axis FAX, the first-1 display area DA1-1 and the first-2 display area DA1-2 may not be viewed from the outside.

Figure 5:
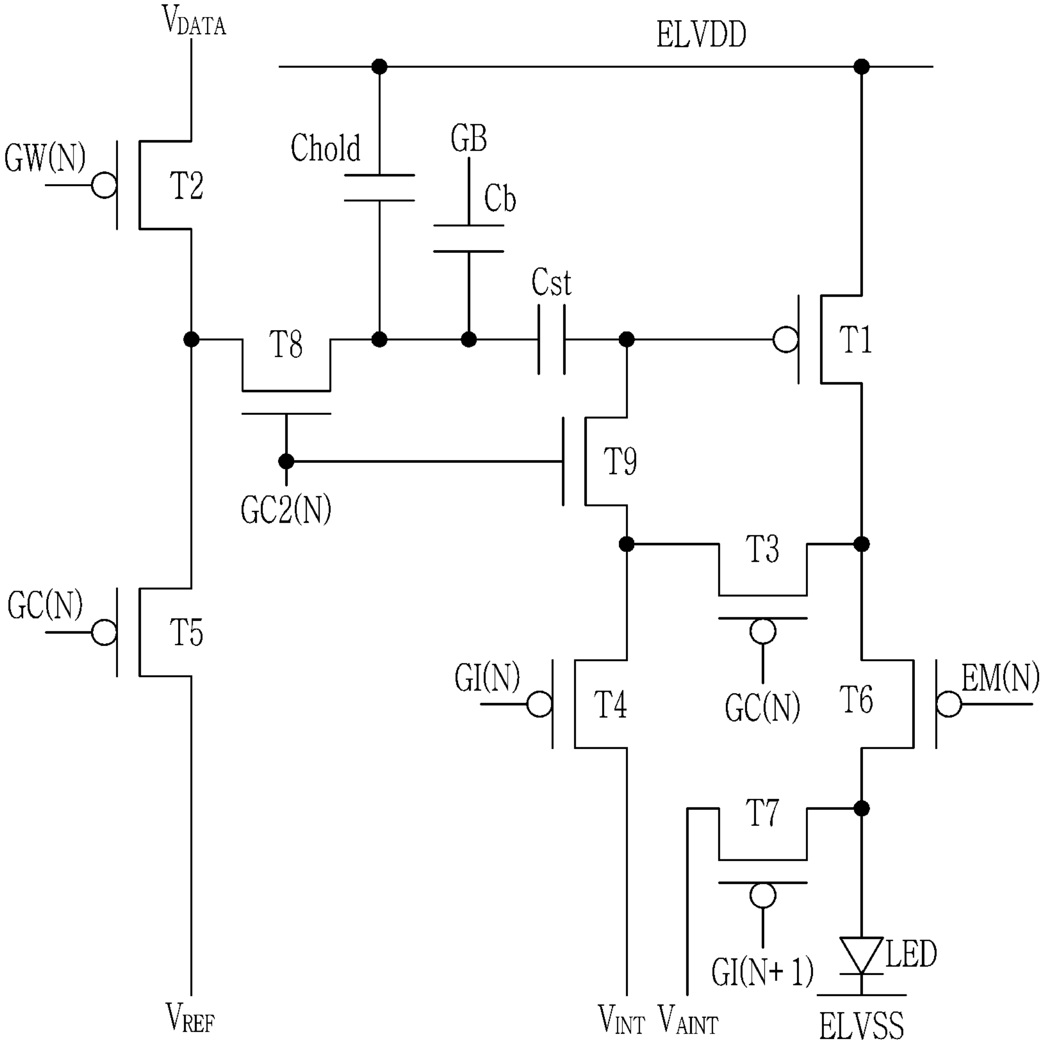
FIG. 5 illustrates a schematic circuit diagram of a pixel included in an emissive display device according to an embodiment.

Hereinafter, a circuit structure of a pixel of an emissive display device according to an embodiment will be described with reference to FIG. 5. FIG. 5 illustrates a schematic circuit diagram of a pixel included in an emissive display device according to an embodiment.

The pixel of FIG. 5 will be described by taking as an example a pixel included in an $N^{th}$ pixel row where multiple pixels may be formed in the display area of the emissive display device.

Referring to FIG. 5, a pixel may include a light emitting diode LED and a pixel circuit unit driving the same, and pixel circuit units are arranged in a matrix form. The pixel circuit unit may include all elements other than the light emitting diode LED in FIG. 5, and the pixel circuit unit of the pixel according to an embodiment of FIG. 5 may include a driving transistor T1, a second transistor T2, a third transistor T3, a fourth transistor T4, a fifth transistor T5, a sixth transistor T6, a seventh transistor T7, an eighth transistor T8, a ninth transistor T9, a storage capacitor Cst, a hold capacitor Chold, and an auxiliary capacitor Cb. The pixel circuit unit may be connected to a first scan line to which a first scan signal GW(N) may be applied, a second scan line to which a second scan signal GC(N) may be applied, a second-1 scan line to which a second-1 scan signal GC2(N) corresponding to the second scan signal GC(N) may be applied, a third scan line to which a third scan signal GI(N+1) may be applied, an emission signal line to which an emission control signal EM(N) may be applied, and a data line to which a data voltage VDATA may be applied. The pixel may receive a driving voltage ELVDD (hereinafter also referred to as a first driving voltage), a driving low voltage ELVSS (hereinafter also referred to as a second driving voltage), a first initialization voltage VINT, a second initialization voltage VAINT, and a reference voltage VREF. In FIG. 5, an additional signal GB applied to a first end (first electrode) of the auxiliary capacitor Cb may have a voltage level that is periodically changed or has a constant voltage value like a scan signal.

A structure of a pixel focusing on each element (transistor, capacitor, and light emitting diode) included in the pixel will be described as follows.

The driving transistor T1 may include a gate electrode connected to a first electrode of the storage capacitor Cst (hereinafter also referred to as a driving gate electrode), a first electrode (input-side electrode) connected to the driving voltage ELVDD, and a second electrode (output-side electrode) that outputs a current depending on a voltage of the gate electrode.

A gate electrode of the driving transistor T1 may be connected to a second electrode (output-side electrode) of the ninth transistor T9 and the first electrode of the storage capacitor Cst. The first electrode of the driving transistor T1 may directly receive the driving voltage ELVDD, and the second electrode of the driving transistor T1 may be connected to a first electrode (input-side electrode) of the third transistor T3 and a first electrode (input-side electrode) of the sixth transistor T6. The output current of the driving transistor T1 may be transmitted to the light emitting diode LED through the sixth transistor T6, to enable the light emitting diode LED to emit light. Luminance of the light emitted from the light emitting diode LED may be determined depending on a magnitude of an output current of the driving transistor T1.

The second transistor T2 (hereafter also referred to as a switching transistor) may include a gate electrode connected to the first scan line to which the first scan signal GW(N) may be applied, a first electrode (input-side electrode) connected to a data line to which a data voltage $V_{DATA}$ is applied, and a second electrode (output-side electrode) connected to a second electrode of the fifth transistor T5 and a first electrode of the eighth transistor T8. In the second transistor T2, the data voltage $V_{DATA}$ may enter the pixel depending on the first scan signal GW(N), and may pass through the eighth transistor T8 to be stored in a second electrode of the storage capacitor Cst.

The third transistor T3 (hereafter also referred to as a first compensation transistor) may include a gate electrode connected to a second scan line to which a second scan signal GC(N) may be applied, a first electrode (input-side electrode) connected to the second electrode of the driving transistor T1, and a second electrode (output-side electrode) connected to the first electrode of the ninth transistor T9. The third transistor T3 may enable a threshold voltage of the driving transistor T1 to be stored and compensated for at the first electrode of the storage capacitor Cst by forming a compensation path for compensating the threshold voltage of the driving transistor T1 together with the ninth transistor T9 (hereinafter also referred to as a second compensation transistor). As a result, even in case that the threshold voltage of the driving transistor T1 included in each pixel is different, the driving transistor T1 may output a constant output current depending on the applied data voltage $V_{DATA}$. The first electrode of the third transistor T3 may also be connected to a first electrode of the sixth transistor T6, and the second electrode of the third transistor T3 is also connected to a second electrode of the fourth transistor T4.

The second transistor T4 (hereafter also referred to as a first initialization transistor) may include a gate electrode connected to a third scan line to which a third scan signal GI(N) may be applied, a first electrode to which the first initialization voltage VINT may be applied, and a second electrode connected to the second electrode of the third transistor T3 and the first electrode of the ninth transistor T9. The fourth transistor T4 may transfer a first initialization voltage $V_{INT}$ into the pixel to initialize each of the second electrode of the third transistor T3 and the first electrode of the ninth transistor T9 to the first initialization voltage VINT, and in case that the third transistor T3 and the ninth transistor T9 are turned on during a subsequent period, may also initialize the gate electrode of the driving transistor T1 connected to the third transistor T3 and the ninth transistor T9, the first electrode of the storage capacitor Cst, the second electrode of the driving transistor T1, and the first electrode of the sixth transistor T6.

The fifth transistor T5 (hereinafter also referred to as a capacitor initializing transistor) may include a gate electrode connected to a second scan line to which a second scan signal GC(N) may be applied, a first electrode to which the reference voltage $V_{REF}$ may be applied, and a second electrode connected to a first electrode of the eighth transistor T8 and the second electrode of the second transistor T2. The fifth transistor may serve to change each of a second electrode of the storage capacitor Cst, a second electrode of the hold capacitor Chold, and a second electrode of the auxiliary capacitor Cb through the eighth transistor T8 to the reference voltage $V_{REF}$ for initialization.

The sixth transistor T6 (hereinafter also referred to as a current transfer transistor) may include a gate electrode connected to an emission signal line to which an emission control signal EM(N) may be applied, a first electrode (input-side electrode) connected to the second electrode of the driving transistor T1, and a second electrode (output-side electrode) connected to an anode of the light emitting diode LED. Herein, a first electrode of the sixth transistor T6 may also be connected to the first electrode of the third transistor T3, and a second electrode of the sixth transistor T6 may also be connected to a second electrode of the seventh transistor T7. The sixth transistor T6 may serve to transmit an output current of the driving transistor T1 to the light emitting diode LED or to block it based on the emission control signal EM(N).

The seventh transistor T7 (hereinafter also referred to as an anode initializing transistor) may include a gate electrode connected to a third scan line of a next row to which a third scan signal GI(N+1) below one row may be applied, and a first electrode to which a second initialization voltage $V_{AINT}$ may be applied and a second electrode connected to the anode of the light emitting diode LED. A second electrode of the seventh transistor T7 may also be connected to a second electrode of the sixth transistor T6. The seventh transistor T7 may have a second initialization voltage $V_{AINT}$ to initialize the anode of the light emitting diode LED. Timing of initializing the anode may be after a third scan signal GI of the row applies a gate-on voltage, and may be before the emission control signal EM(n) applies the gate-on voltage.

The eighth transistor T8 (hereinafter also referred to as a transfer transistor) may include a gate electrode connected to the second-1 scan line with the second scan signal GC2(*n*), a first electrode connected to the second electrode of the second transistor T2 and the second electrode of the fifth transistor T5, a second electrode of the storage capacitor CST, a second electrode of the hold capacitor Chold, and a second electrode connected to the second electrode of the auxiliary capacitor Cb. The eighth transistor T8 may serve to change a voltage of the gate electrode of the driving transistor T1 by transferring the data voltage $V_{DATA}$ or the reference voltage $V_{REF}$ to the second electrode of the storage capacitor Cst.

The ninth transistor T9 (second compensation transistor) may include a gate electrode connected to the second-1 scan line to which the second-1 scan signal GC2(N) may be applied, a first electrode connected to the second electrode of the third transistor T3 and the second electrode of the fourth transistor T4, and a second electrode connected to the gate electrode of the driving transistor T1 and the first electrode of the storage capacitor Cst. The ninth transistor T9 may enable a threshold voltage of the driving transistor T1 to be stored and compensated for at the first electrode of the storage capacitor Cst by forming a compensation path for compensating the threshold voltage of the driving transistor T1 together with the third transistor T3. As a result, even in case that the threshold voltage of the driving transistor T1 included in each pixel is different, the driving transistor T1 may output a constant output current depending on the applied data voltage $V_{DATA}$.

In an embodiment of FIG. 5, all transistors may be divided into a p-type transistor formed using a polycrystalline semiconductor and an n-type transistor formed using an oxide semiconductor. Referring to FIG. 5, the driving transistor T1, the second transistor T2, the third transistor T3, the fourth transistor T4, the fifth transistor T5, the sixth transistor T6, and the seventh transistor T7 may include a polycrystalline semiconductor, and the eighth transistor T8 and the ninth transistor T9 may include an oxide semiconductor. The p-type transistor formed using the polycrystalline semiconductor may be turned on by a low-level voltage and turned off by a high-level voltage. In contrast, the n-type transistor formed using the oxide semiconductor may be turned on by a high-level voltage and turned off by a low-level voltage.

The storage capacitor Cst (hereinafter also referred to as a voltage transfer capacitor) may include a first electrode connected to the gate electrode of the driving transistor T1 and the second electrode of the ninth transistor T9, and a second electrode connected to the second electrode of the eighth transistor T8, the second electrode of the hold capacitor Chold, and the second electrode of the auxiliary capacitor Cb. The storage capacitor Cst may serve to receive the data voltage $V_{DATA}$ through the second transistor T2 and the eighth transistor T8, or receive the reference voltage $V_{REF}$ through the fifth transistor T5 and the eighth transistor T8 to change the voltage of the gate electrode of the driving transistor T1, and to maintain the received voltage until a next voltage may be transferred. In the pixel of an embodiment, the data voltage $V_{DATA}$ may not be directly transferred to the gate electrode of the driving transistor T1, but may be transferred through the storage capacitor Cst. This is a method of indirectly transferring the data voltage $V_{DATA}$ to the gate electrode of the driving transistor T1 by using the fact that the voltage of the first electrode, which may be a second-side electrode, also rises, in case that a voltage of the second electrode of the storage capacitor Cst suddenly rises. Depending on this method, even in case that leakage occurs in at least one transistor (e.g., the second transistor T2) among the transistors included in the pixel, a voltage of the gate electrode of the driving transistor T1 may not directly leak, and thus an effect thereof may be small. In an embodiment, the data voltage $V_{DATA}$ may be transferred directly to the gate electrode of the driving transistor T1 through the storage capacitor Cst without passing through another electrode of the driving transistor T1, and thus even in case that there is a difference in the driving voltage ELVDD depending on a position of the pixel, a voltage stored in the storage capacitor Cst may be determined without affecting the difference in the driving voltage ELVDD.

The hold capacitor Chold may include a first electrode to which the driving voltage ELVDD may be applied and a second electrode connected to the second electrode of the storage capacitor Cst, and may serve to constantly maintain the voltage of the second electrode of the storage capacitor Cst. Further, the second electrode of the hold capacitor Chold may additionally be connected to the second electrode of the eighth transistor T8 and the second electrode of the auxiliary capacitor Cb.

The auxiliary capacitor Cb may include a first electrode to which the additional signal GB may be transferred, and a second electrode connected to the second electrode of the storage capacitor Cst and the second electrode of the hold capacitor Chold. The second electrode of the auxiliary capacitor Cb may additionally be connected to the second electrode of the eighth transistor T8. The auxiliary capacitor Cb may serve to constantly maintain the voltage of the second electrode of the holding capacitor Cst together with the hold capacitor Chold, and may additionally compensate the voltage of the second electrode of the storage capacitor Cst depending on the additional signal GB applied to the first electrode.

Depending on the hold capacitor Chold and the auxiliary capacitor Cb, the voltage of the second electrode of the holding capacitor Cst may be held without being changed even in case that surrounding signals are changed, so that it may have a constant voltage.

In case that a voltage level of the additional signal GB is changed, the auxiliary capacitor Cb may compensate the voltage of the second electrode of the storage capacitor Cst depending on a change degree of the additional signal GB.

The light emitting diode LED may include an anode connected to the second electrode of the sixth transistor T6 and a cathode connected to the driving low voltage ELVSS. The light emitting diode LED may be positioned between the pixel circuit unit and the driving low voltage ELVSS to emit light with luminance corresponding to a current supplied from the pixel circuit unit (more precisely, the driving transistor T1). The light emitting diode LED may include an emission layer including at least one of an organic emission material and an inorganic emission material. Holes and electrons may be injected from the anode and the cathode into the emission layer, and excitons formed by combining the injected holes and electrons may be emitted in case that they fall from an excited state to a ground state. The light emitting diode LED may emit light of one of primary colors or white light. Examples of the primary colors may include three primary colors of red, green, and blue. Other examples of the primary colors include yellow, cyan, and magenta. According to an embodiment, a color display characteristic may be improved by further including an additional color filter or a color conversion layer.

In FIG. 5, the equivalent capacitor viewed from the gate electrode of the driving transistor T1 has a structure in which the hold capacitor Chold connected in parallel with the holding capacitor Cst and an auxiliary capacitor Cb may be connected in series, and thus in case that capacitance of the equivalent capacitor (hereinafter referred to as equivalent capacitance or converted capacitance) is calculated, it may have a value of Equation 1 below.

$$\text{Converted capacitance}=C1\times\{(C2+C3\}/(C1+C2+C3)\} \quad \text{[Equation 1]}$$

In Equation 1, C1 may represent the capacitance of the storage capacitor Cst, C2 may represent the capacitance of the hold capacitor Chold, and C3 may represent the capacitance of the auxiliary capacitor Cb.

In Equation 1, a converted capacitance value may have a larger value than that in case a value of C3 is 0, i.e., in case the auxiliary capacitor Cb is not formed, and than that in case the value of C3 exists, i.e., in case the auxiliary capacitor Cb is formed. Accordingly, in the pixel having the circuit diagram of FIG. 5, the gate voltage of the driving transistor T1 may be less affected by surroundings. As such, the gate voltage of the driving transistor T1 may be well maintained, and thus in case of driving at a low frequency, it may be possible to reduce a difference in luminance that may occur at high grays, and in case of driving at high frequencies, crosstalk may be eliminated or power consumption may be reduced.

Figure 6:
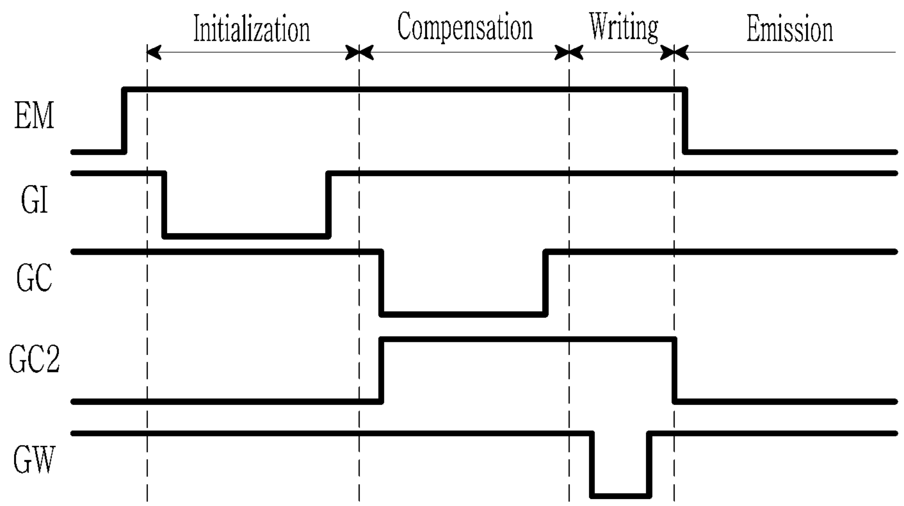
FIG. 6 illustrates a schematic waveform diagram showing a signal applied to the pixel of FIG. 5.

Hereinafter, an operation of a pixel in case a signal of a waveform of FIG. 6 is applied to the pixel of FIG. 5 will be described in detail. FIG. 6 illustrates a schematic waveform diagram showing a signal applied to the pixel of FIG. 5.

Referring to FIG. 6, in case that a signal applied to a pixel is divided into periods, it may be divided into an initialization period, a compensation period, a writing period, and an emission period.

First, the emission period may be a period during which the light emitting diode LED emits light, and may be a period during which an emission signal may be applied to the gate-on voltage (low level voltage) to turn on the sixth transistor T6, and an output current of the driving transistor T1 may be transferred to the light emitting diode LED through the turned-on sixth transistor T6 so that the light emitting diode LED emits light. In FIG. 6, the emission period during which the emission signal applies a gate-on voltage is hardly illustrated, but in reality, the emission period may have a longest time. However, the emission period may be simply illustrated in FIG. 6 without specific explanation because only the above simple operation may be performed.

In case that the emission period ends, the initialization period may be entered.

The emission period may end as the emission signal may be changed to a gate-off voltage (high level voltage). A period to which the gate-off voltage of the emission signal may be applied includes an initialization period, a compensation period, and a writing period.

The initialization period may be a period during which a third scan signal GI(N) is changed to a gate-on voltage (low level voltage).

During the initialization period, the fourth transistor T4 to which the third scan signal GI(N) may be applied may be turned on to perform primary initialization by changing a portion (the second electrode of the third transistor T3 and the first electrode of the ninth transistor T9) connected to the second electrode of the fourth transistor T4 to the first initialization voltage $V_{INT}$. Herein, the first initialization voltage $V_{INT}$ may have a low-level voltage value, and according to an embodiment, the first initialization voltage $V_{INT}$ may be a low voltage capable of turning on the driving transistor T1.

The seventh transistor T7 may be turned on by the third scan signal GI(N+1) applied to a next row to change a portion (the anode of the light emitting diode LED and the second electrode of the sixth transistor T6) connected to the second electrode of the seventh transistor T7 to the second initialization voltage $V_{AINT}$ to be secondly initialized. The second initialization period may start and end later than the initialization period illustrated in FIG. 6 by 1H.

In case that the initialization period ends, the compensation period may be entered.

The compensation period may be a period during which a gate-on voltage may be applied to a second scan signal GC(N) and a second-1 scan signal GC2(N), and referring to FIG. 6, a low level voltage may be applied to the second scan signal GC(N) as a gate-on voltage, and a high level voltage may be applied to the second-1 scan signal GC2(N) as a gate-on voltage.

During the compensation period, the third transistor T3 and the fifth transistor T5 to which a second scan signal GC(N) may be applied may be turned on, and the eighth transistor T8 and the ninth transistor T9 to which a second-1 scan signal GC2(N) may be applied may also be turned on.

First, the fifth transistor T5 and the eighth transistor T8 may be turned on, to transfer the reference voltage $V_{REF}$ applied to the first electrode of the fifth transistor T5 to the second electrode of the storage capacitor Cst, the second electrode of the hold capacitor Chold, and the second electrode of the auxiliary capacitor Cb through the eighth transistor T8. By the action of the reference voltage $V_{REF}$, a voltage at a first end of each capacitor (the second electrode of the storage capacitor Cst, the second electrode of the hold capacitor Chold, and the second electrode of the auxiliary capacitor Cb) may become constant.

The third transistor T3 and the ninth transistor T9 may be turned on to transfer the first initialization voltage $V_{INT}$ applied to the second electrode of the third transistor T3 and the first electrode of the ninth transistor T9 to the gate electrode and the second electrode of the driving transistor T1, respectively, during the initialization period. The driving transistor T1 may have a diode connection structure in which a gate electrode and a second electrode may be connected. The driving transistor T1 may be turned on by the first initialization voltage $V_{INT}$, and the driving voltage ELVDD connected to the first electrode of the driving transistor T1 may be transferred to the gate electrode of the driving transistor T1 and the first electrode of the storage capacitor Cst through the second electrode of the driving transistor T1, the third transistor T3, and the ninth transistor T9. Accordingly, a voltage of the gate electrode of the driving transistor T1 may gradually rise from the first initialization voltage $V_{INT}$ and may be turned off in case that the voltage is lower than the driving voltage ELVDD by a threshold voltage of the driving transistor T1. The voltage of the gate electrode of the driving transistor T1 may be stored in the first electrode of the storage capacitor Cst, and the voltage of the first electrode of the storage capacitor Cst may be expressed by Equation 2 below.

$$Vcst1 = V_{ELVDD} - Vth \qquad \text{[Equation 2]}$$

Herein, Vcst1 may indicate the voltage of the first electrode of the holding capacitor Cst, $V_{ELVDD}$ may indicate a voltage value of the driving voltage ELVDD, and Vth may indicate the threshold voltage value of the driving transistor T1.

According to Equation 2, a threshold voltage Vth that may be different for each driving transistor T1 may be compensated.

After the compensation period as described above, the second electrode of the storage capacitor Cst may have the reference voltage $V_{REF}$, and the first electrode may have a voltage value of Equation 2.

In case that the compensation period ends, the writing period may be entered.

During the writing period, as illustrated in FIG. 6, a second scan signal GC(N) may be changed to a gate-off voltage (high level voltage), and a first scan signal GW(N) may be changed to a gate-on voltage (low level voltage). The gate-on voltage may be continuously applied to a second-1 scan signal GC2(N) to maintain turned-on states of the eighth transistor T8 and the ninth transistor T9.

During the writing period, the second transistor T2 to which a first scan signal GW(N) may be applied may be turned on to output the data voltage $V_{DATA}$ to the second electrode of the second transistor T2 and transfer it to the second electrode of the holding capacitor Cst, the second electrode of the hold capacitor Chold, and the second electrode of the auxiliary capacitor Cb through the eighth transistor T8.

During the writing period, the second electrode of the storage capacitor Cst may be changed to the data voltage $V_{DATA}$ from the reference voltage $V_{REF}$, which may be a voltage applied to the compensation period. The voltage value of the first electrode of the storage capacitor Cst may be changed in proportion to a voltage change amount of the second electrode of the storage capacitor Cst. For example, the voltage change amount of the second electrode of the storage capacitor Cst may be a voltage difference between the data voltage $V_{DATA}$ and the reference voltage $V_{REF}$, and thus the voltage of the first electrode of the storage capacitor Cst may additionally be changed from the voltage value of Equation 1 by a value proportional to the voltage difference between the data voltage $V_{DATA}$ and the reference voltage $V_{REF}$. The voltage value of the first electrode of the storage capacitor Cst may be decreased. As the voltage value of the gate electrode of the driving transistor T1 may be lowered, a degree to which the driving transistor T1 may be turned on may be determined and a magnitude of an output current may be determined.

In FIG. 6, the writing period may proceed for 1H, 1H may indicate one horizontal period, and one horizontal period may correspond to one horizontal synchronization signal. 1H may indicate a time for which a gate-on voltage may be applied to a scan line of a next row after the gate-on voltage may be applied to a scan line. Referring to FIG. 6, it can be checked that the initialization period, the compensation period, and the emission period may be longer than the writing period of 1H, and according to an embodiment, the compensation period may have a time of 3H or more so that the threshold voltage of the driving transistor T1 can be sufficiently compensated. For example, in case that a pixel separates the compensation period for compensating for a threshold voltage of the driving transistor T1 and the writing period for writing the data voltage $V_{DATA}$ and high-speed driving is performed by making a compensation time more than three times longer than the writing period 1H, although the time of 1H is very short, the compensation time may not be insufficient so that sufficient compensation can be achieved during the high-speed driving by securing the time of 3H or more.

In the above, a circuit structure and an operation of a pixel have been described.

Hereinafter, a display panel layer of a display device according to an embodiment will be described with reference to FIG. 7 to FIG. 18. FIG. 7 to FIG. 17 each schematically illustrate a structure of each layer depending on a manufacturing order of a display panel layer in a display device according to an embodiment, and FIG. 18 illustrates a schematic cross-section of a display panel layer.

Figure 7:
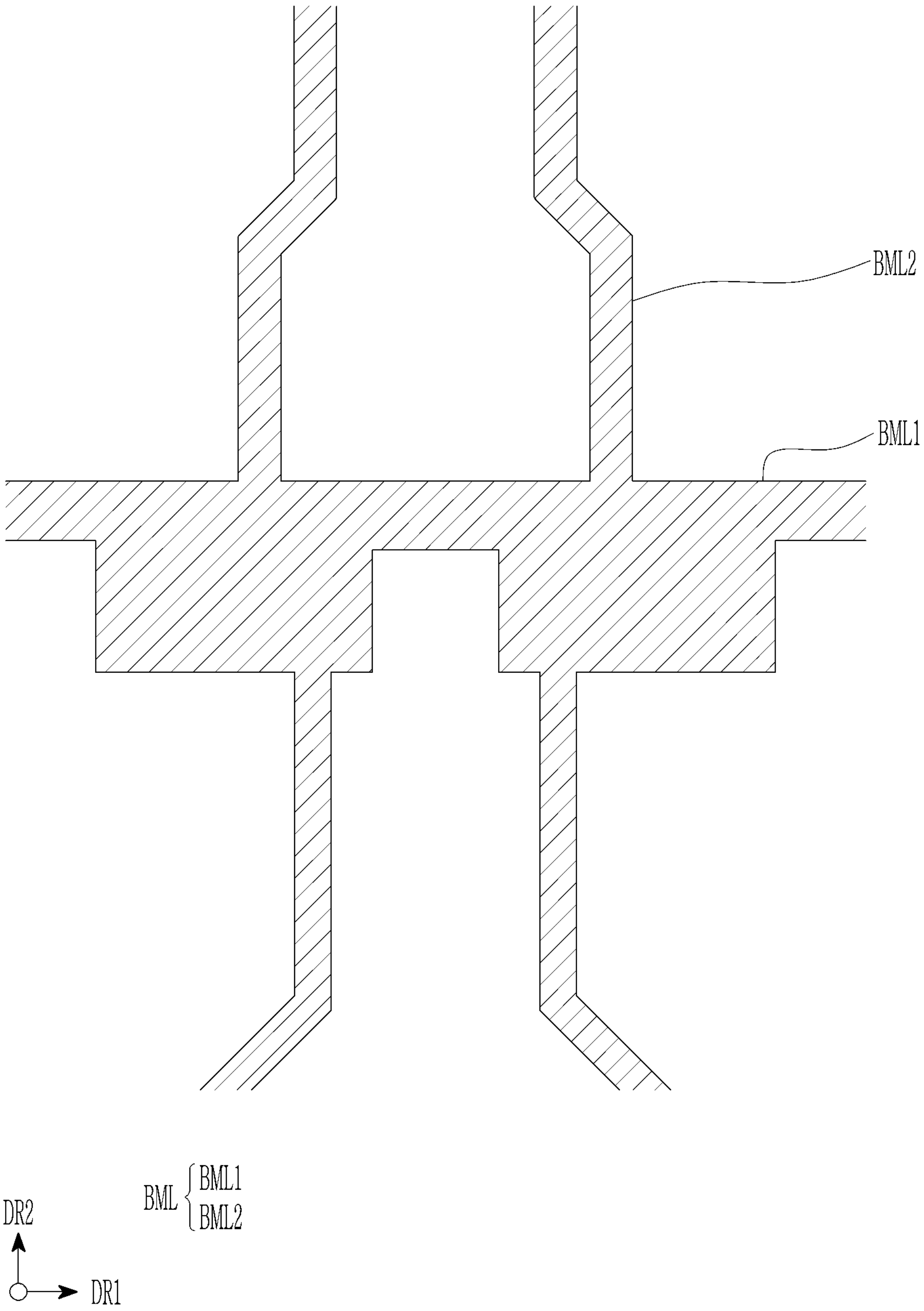
FIG. 7 to FIG. 17 each schematically illustrate a structure of each layer depending on a manufacturing order of a display panel layer in a display device according to an embodiment.
Figure 8:
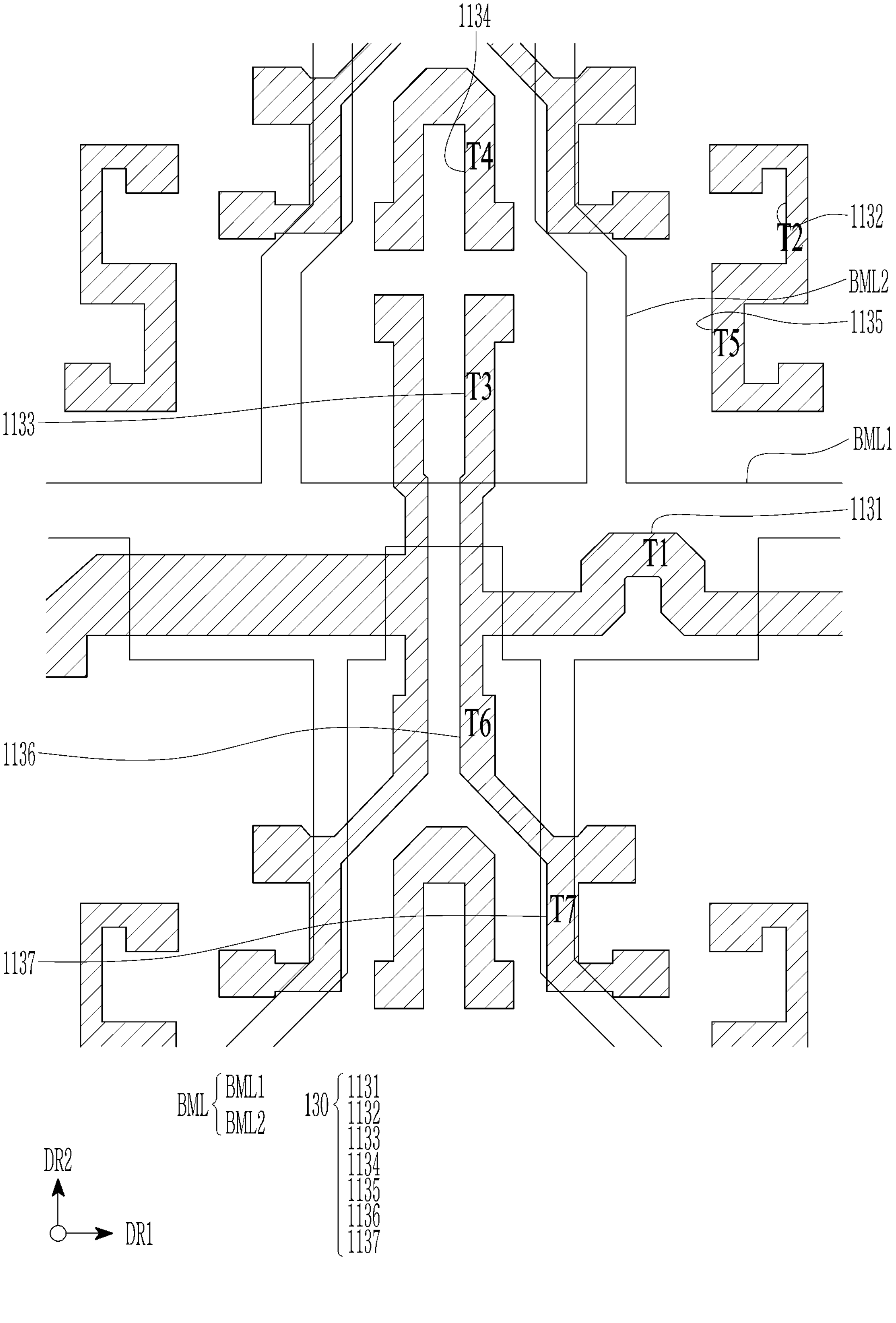

First, referring to FIG. 7 and FIG. 8, a lower metal layer BML may be positioned on the substrate SUB.

The substrate SUB may include a material that has a rigid property such as glass so as to not bend, or may include a flexible material that can be bent, such as plastic or a polyimide. In the case of a flexible substrate, it may be to have a structure in which a two-layer structure of a polyimide and a barrier layer formed of an inorganic insulating material thereon is repeatedly formed.

The lower metal layer BML may include multiple extensions BML1 and a connector BML2 connecting the extensions BML1 to each other. The extensions BML1 of the lower metal layer BML may be formed at a position overlapping a channel of the driving transistor T1 in a plan view among first semiconductor layers to be described below.

The lower metal layer BML may also be called a lower shielding layer, may include a metal such as copper (Cu), molybdenum (Mo), aluminum (Al), or titanium (Ti), or a metal alloy thereof, may additionally include amorphous silicon, and may be formed to include a single layer or multiple layers.

Referring to FIG. 18, a buffer layer BF covering the substrate SUB and the metal layer BML may be disposed on the substrate SUB and the metal layer BML. The buffer layer BF may serve to block penetration of impurity elements into a first semiconductor layer 130, and may be an inorganic insulating layer including a silicon oxide ($SiO_x$), a silicon nitride ($SiN_x$), a silicon oxynitride ($SiO_xN_y$), and/or the like.

Referring to FIG. 8, the first semiconductor layer 130 formed of a silicon semiconductor (e.g., a polycrystalline semiconductor) may be positioned on the buffer layer BF. A portion of the first semiconductor layer 130 may have same or similar characteristics as the conductor by plasma treatment or being doped with impurities, so that charges may be transferred. A channel portion of a transistor of the first semiconductor layer 130 may not be doped with impurities.

The first semiconductor layer 130 may include semiconductors 1131, 1132, 1133, 1134, 1135, 1136, and 1137 included in each transistor. The driving transistor T1 may include a first semiconductor 1131, the second transistor T2 may include a second semiconductor 1132, the third transistor T3 may include a third semiconductor 1133, the fourth transistor T4 may include a fourth semiconductor 1134, the fifth transistor T5 may include a fifth semiconductor 1135, the sixth transistor T6 may include a sixth semiconductor 1136, and the seventh transistor T7 may include a seventh semiconductor 1137. In FIG. 8, the first semiconductor 1131 of the driving transistor T1 may additionally include a first region and a second region, the first region may correspond to the first electrode of the driving transistor T1, and the second region may correspond to the second electrode of the driving transistor T1. A channel region of the driving transistor T1 may be positioned between the first region and the second region of the first semiconductor 1131. The semiconductors 1132, 1133, 1134, 1135, 1136, and 1137 included in the second transistors T2 to T7 may each include a first region and a second region, the first region may correspond to the first electrode, and the second region may correspond to the second electrode. A channel region of each transistor may be positioned between the first region and the second region.

The third transistor T3 may be positioned in a portion of the first semiconductor layer 130 extending upward from the second region of the driving transistor T1. The sixth transistor T6 and the seventh transistor T7 may be positioned in a portion extending downward from the second region of the driving transistor T1. It may not be connected to the first transistor T1, and the fourth transistor T4 may be positioned adjacent to the seventh transistor T7 in a first direction. Further, the second transistor T2 and the fifth transistor T5 may be positioned adjacent to the seventh transistor T7 in a second direction.

Referring to FIG. 18, a first gate insulating layer GI1 may be positioned on the first semiconductor layer 130. The first gate insulating layer GI1 may include an inorganic insulating layer including a silicon oxide (SiOx), a silicon nitride (SiNx), a silicon oxynitride ($SiO_xN_y$), and/or the like.

Figure 9:
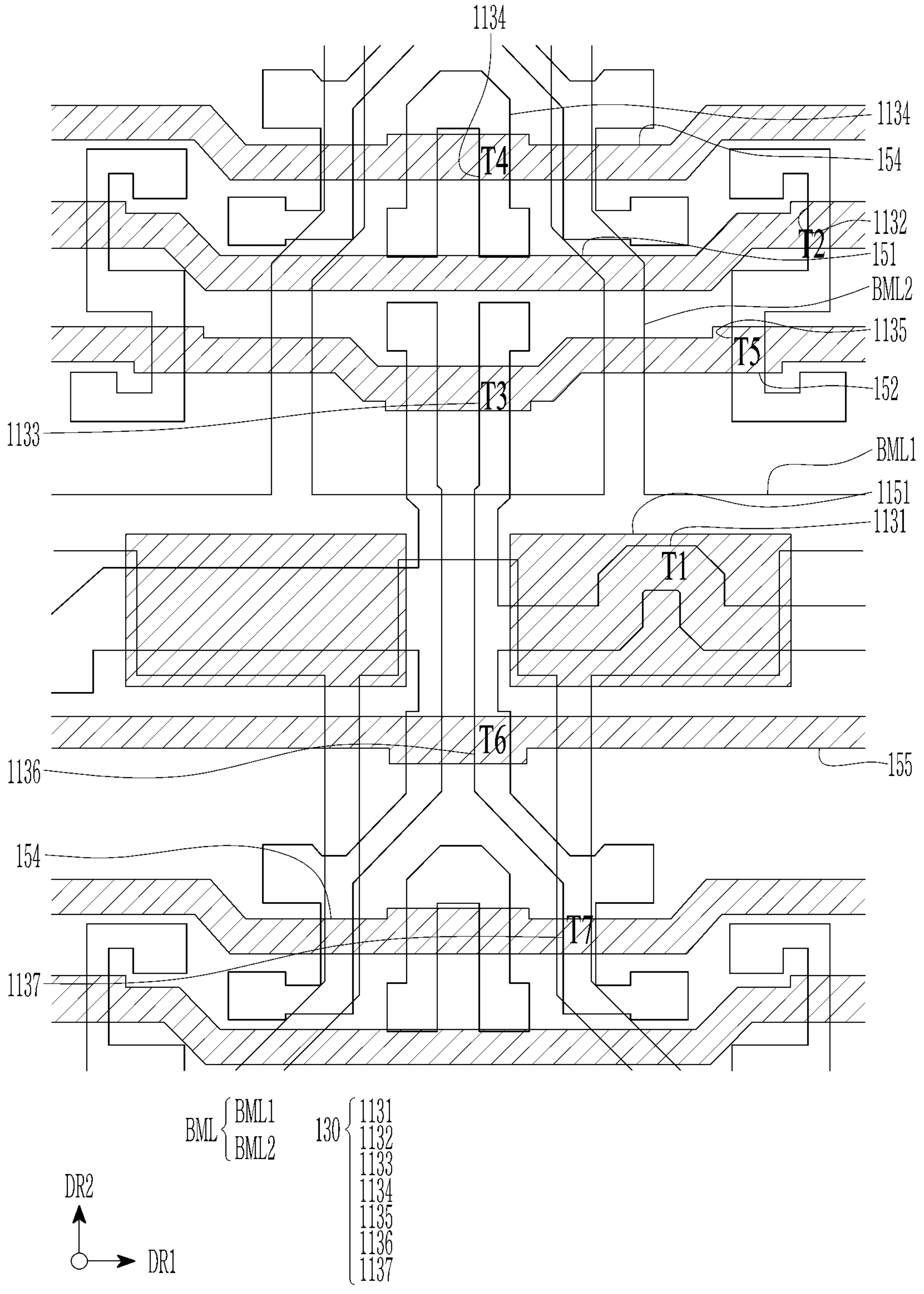

Referring to FIG. 9, a first gate conductive layer including a first gate electrode 1151 of the driving transistor T1 may be positioned on the first gate insulating layer GI1. The first gate conductive layer may include the gate electrode of each of the second transistors T2 to T7 as well as the driving transistor T1. The gate electrode 1151 of the driving transistor T1 may overlap the channel of the driving transistor T1. The channel of the driving transistor T1 may overlap the electrode channel 1151 of the driving transistor T1.

The first gate conductive layer may further include a first scan line 151, a second scan line 152, a third scan line 154, and an emission control line 155. The first scan line 151, the second scan line 152, the third scan line 154, and the emission control line 155 may extend in an approximately horizontal direction (hereinafter also referred to as a first direction DR1).

The first scan line 151 may be connected to the gate electrode of the second transistor T2. The first scan line 151 may be integrally formed with the gate electrode of the second transistor T2.

The second scan line 152 may be connected to the gate electrode of the third transistor T3. The second scan line 152 may be integrally formed with the gate electrode of the third transistor T3. The second scan line 152 may be connected to the gate electrode of the fifth transistor T5. The second scan line 152 may be integrally formed with the gate electrode of the fifth transistor T5.

The third scan line 154 may be connected to the gate electrode of the fourth transistor T4. The third scan line 154 may be integrally formed with the gate electrode of the fourth transistor T4. The third scan line 154 may also be connected to the gate electrode of the seventh transistor T7 of a previous pixel. The third scan line 154 may be integrally formed with the gate electrode of the seventh transistor T7.

The emission control line 155 may be connected to the gate electrode of the sixth transistor T6. The emission control line 155 may be integrally formed with the gate electrode of the sixth transistor T6.

The first gate conductive layer may include a metal such as copper (Cu), molybdenum (Mo), aluminum (Al), titanium (Ti), and/or a metal alloy thereof, and may be configured as a single layer or a multiple layer.

After the first gate conductive layer including the gate electrode 1151 of the driving transistor T1 may be formed, plasma treatment or a doping process may be performed to make an exposed region of the first semiconductor layer 130 conductive. For example, the first semiconductor layer covered by the first gate conductive layer may not be conductive, and a portion of the first semiconductor layer not covered by the first gate conductive layer may have a same characteristic as that of the conductive layer. As a result, the transistor including the conductive portion has a p-type transistor characteristic, so that the first to seventh transistors T1 to T7 may be p-type transistors.

Referring to FIG. 18, a second gate insulating layer GI2 may be disposed on the first gate insulating layer GI1 and the first gate conductive layer GAT1 including the gate electrode of the driving transistor T1. The second gate insulating layer GI2 may include an inorganic insulating layer including a silicon oxide ($SiO_x$), a silicon nitride ($SiN_x$), a silicon oxynitride ($SiO_xN_y$), and/or the like.

Figure 10:
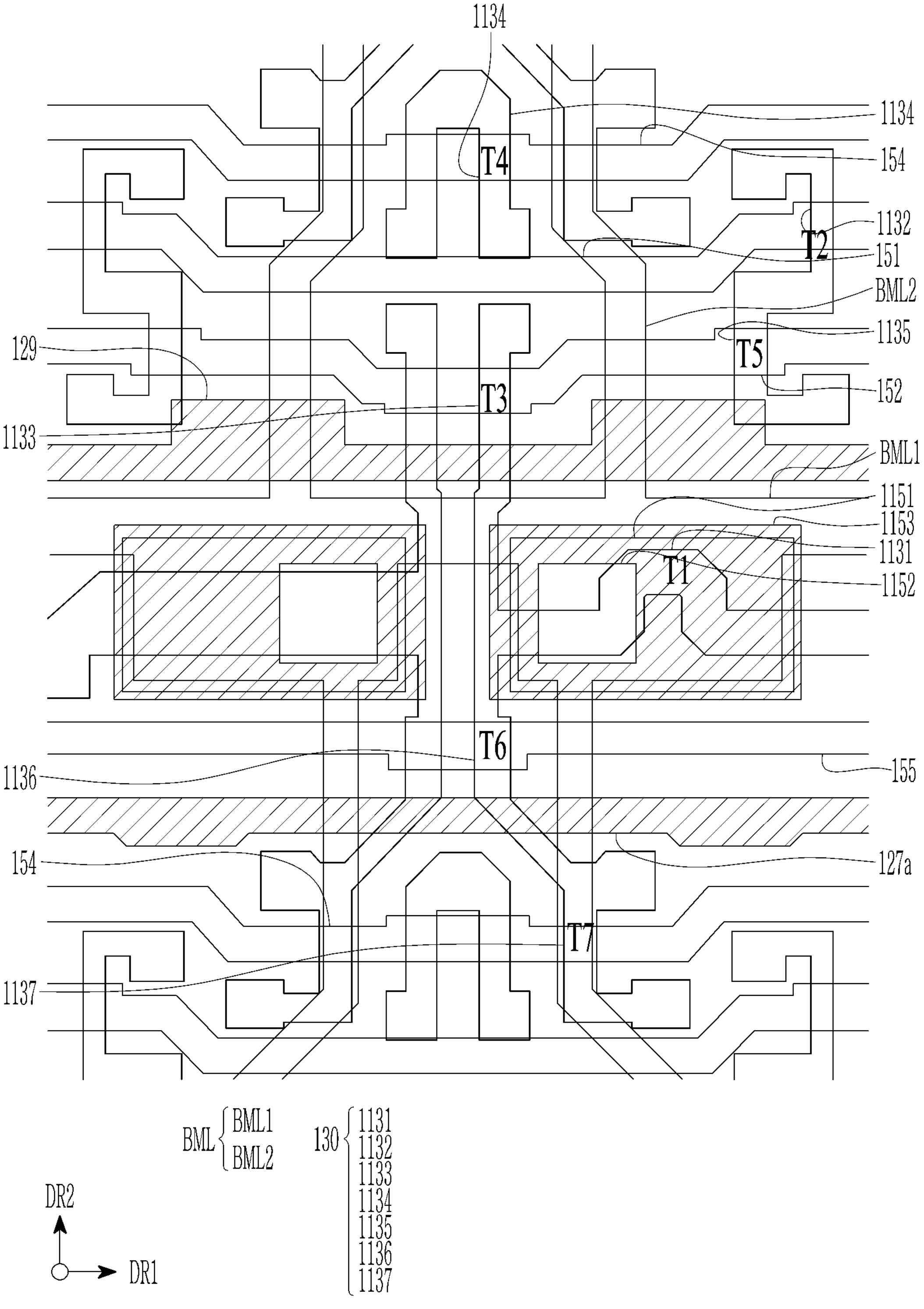

Referring to FIG. 10, a second gate conductive layer including the first storage electrode 1153 of the storage capacitor Cst and a lower shielding layer 129 of the eighth transistor T8 and the ninth transistor T9 may be positioned on the second gate insulating layer GI2. The lower shielding layer 129 may be positioned below channels of each of the fourth transistor T8 and the ninth transistor T9, to perform shielding from light, electromagnetic interference, or the like provided to the channels from a lower side thereof.

The first storage electrode 1153 may overlap the gate electrode 1151 of the driving transistor T1 to constitute the storage capacitor Cst. A first opening 1152 may be formed in the first storage electrode 1153 of the storage capacitor Cst. The first opening 1152 of the first storage electrode 1153 of the storage capacitor Cst may overlap the gate electrode 1151 of the driving transistor T1.

The second gate conductive layer may further include a lower first initialization voltage line 127*a*. The lower first initialization voltage line 127*a* may receive a first initialization voltage. The lower first initialization voltage line 127*a* may extend in an approximately horizontal direction (first direction).

The second gate conductive layer may include a metal such as copper (Cu), molybdenum (Mo), aluminum (Al), titanium (Ti), and/or a metal alloy thereof, and may be configured as a single layer or a multiple layer.

Referring to FIG. 18, a first insulating layer IL1 may be positioned on the second gate conductive layer GAT2. The first insulating layer IL1 may include an inorganic insulating layer including a silicon oxide ($SiO_x$), a silicon nitride ($SiN_x$), a silicon oxynitride ($SiO_xN_y$), and/or the like, and according to an embodiment, an inorganic insulating material may be thickly formed.

Figure 11:
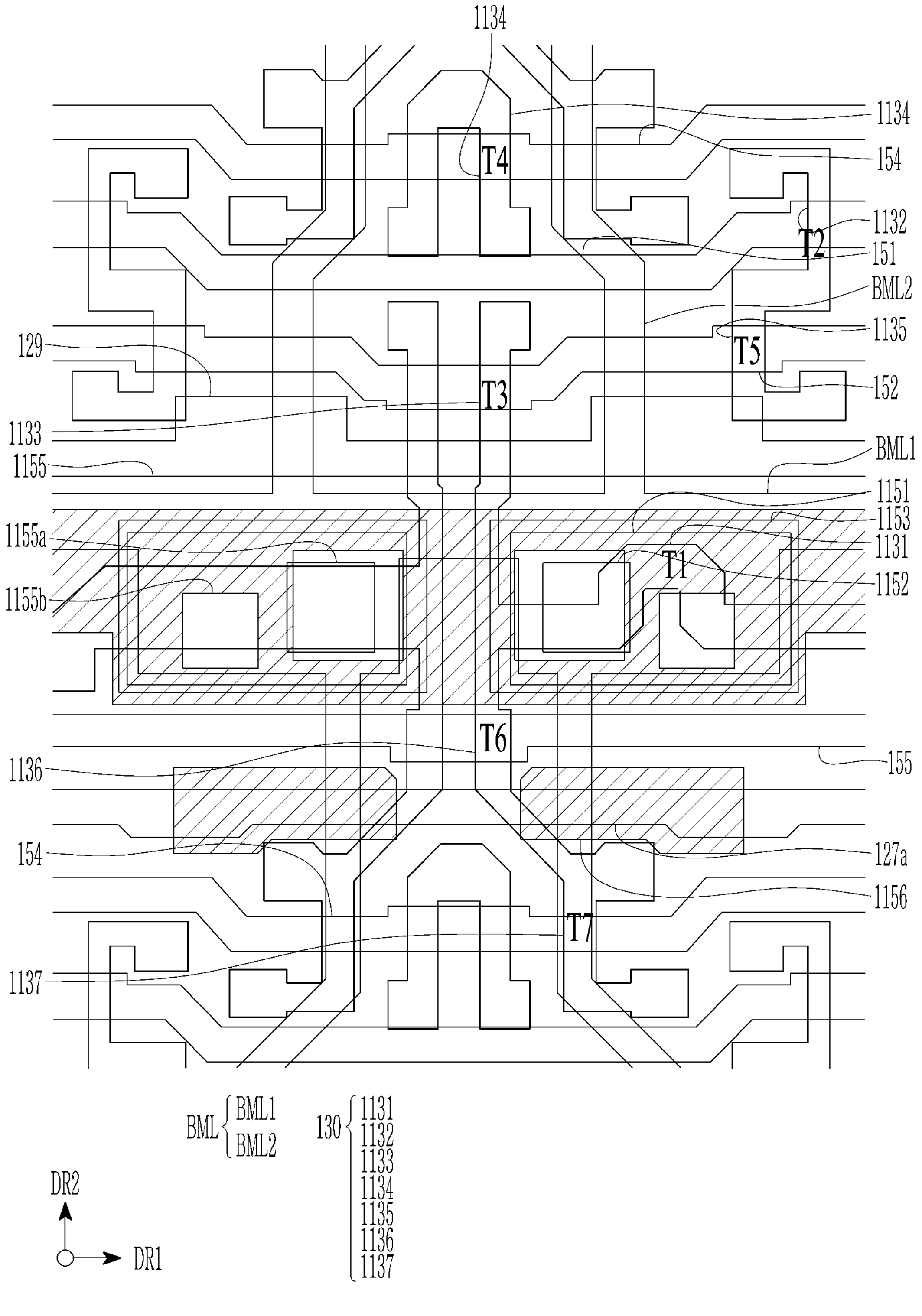

Referring to FIG. 11, a first metal layer may be positioned on the first insulating layer IL1. The first metal layer may further include a first electrode 1155 of the hold capacitor Chold.

The first electrode 1155 of the hold capacitor Chold may include a second opening 1155*a* and a third opening 1155*b*. The second opening 1155*a* may overlap the first opening 1152 of the first storage electrode 1153. The third opening 1155*b* may overlap the first storage electrode 1153. Hydrogen generated during a manufacturing process may be discharged through the second opening 1155*a* and the third opening 1155*b*.

Referring to FIG. 18, a second insulating layer IL2 may be disposed on a first metal layer MTL. The second insulating layer IL2 may include an inorganic insulating layer including a silicon oxide (SiOx), a silicon nitride (SiNx), a silicon oxynitride ($SiO_xN_y$), and/or the like.

Figure 12:
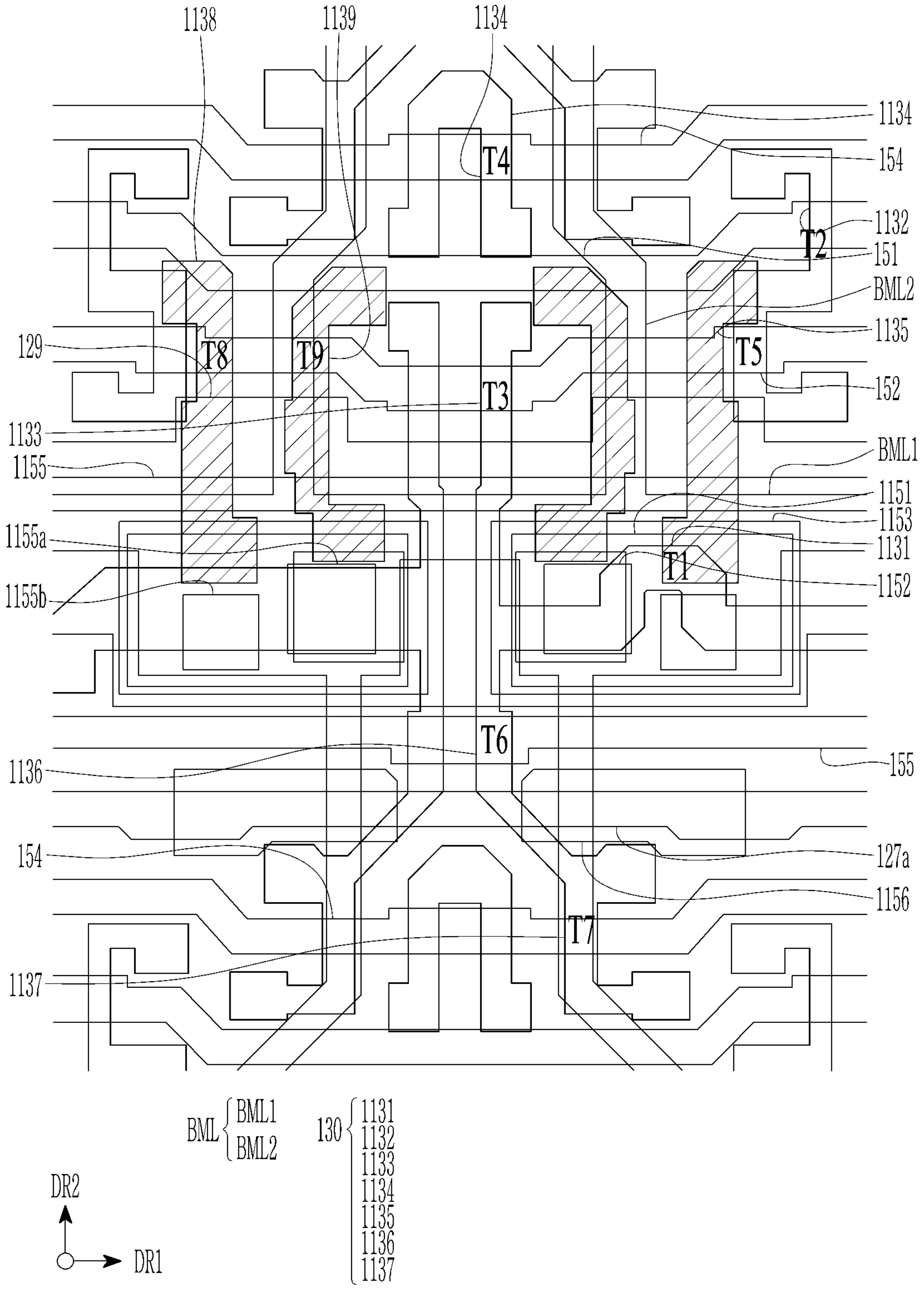

Referring to FIG. 12, second semiconductor layers 1138 and 1139 including the channel, the first region, and the second region of the eighth transistor T8, and the channel, the first region, and the second region of the ninth transistor T9, may be positioned on the second insulating layer IL2. The second semiconductor layers 1138 and 1139 may include an oxide semiconductor.

The channel, the first region, and the second region of the eighth transistor T8, and the channel, the first region, and the second region of the ninth transistor T9, may be spaced apart from each other, but the disclosure is not limited thereto, and they may be connected to each other and formed integrally. The channel of the eighth transistor T8 and the channel of the ninth transistor T9 may overlap the lower shielding layer 129.

Referring to FIG. 18, a third gate insulating layer GI3 may be disposed on a second semiconductor layer ACT2 and the second insulating layer IL2. The third gate insulating layer GI3 may include an inorganic insulating layer including a silicon oxide ($SiO_x$), a silicon nitride ($SiN_x$), a silicon oxynitride ($SiO_xN_y$), and/or the like.

The third gate insulating layer GI3 may be disposed on front surfaces of the second semiconductor layer ACT2 and the second insulating layer IL2. The third gate insulating layer GI3 may cover an upper surface and a side surface of the second semiconductor layer ACT2. However, the disclosure is not limited thereto, and the third gate insulating layer GI3 may not be disposed on entire surfaces of the second semiconductor layer ACT2 and the second insulating layer IL2. For example, the third gate insulating layer GI3 may overlap the channel of the eighth transistor T8, and may not overlap the first region and the second region. The third gate insulating layer GI3 may overlap the channel of the ninth transistor T9 and may not overlap the first region and the second region.

Figure 13:
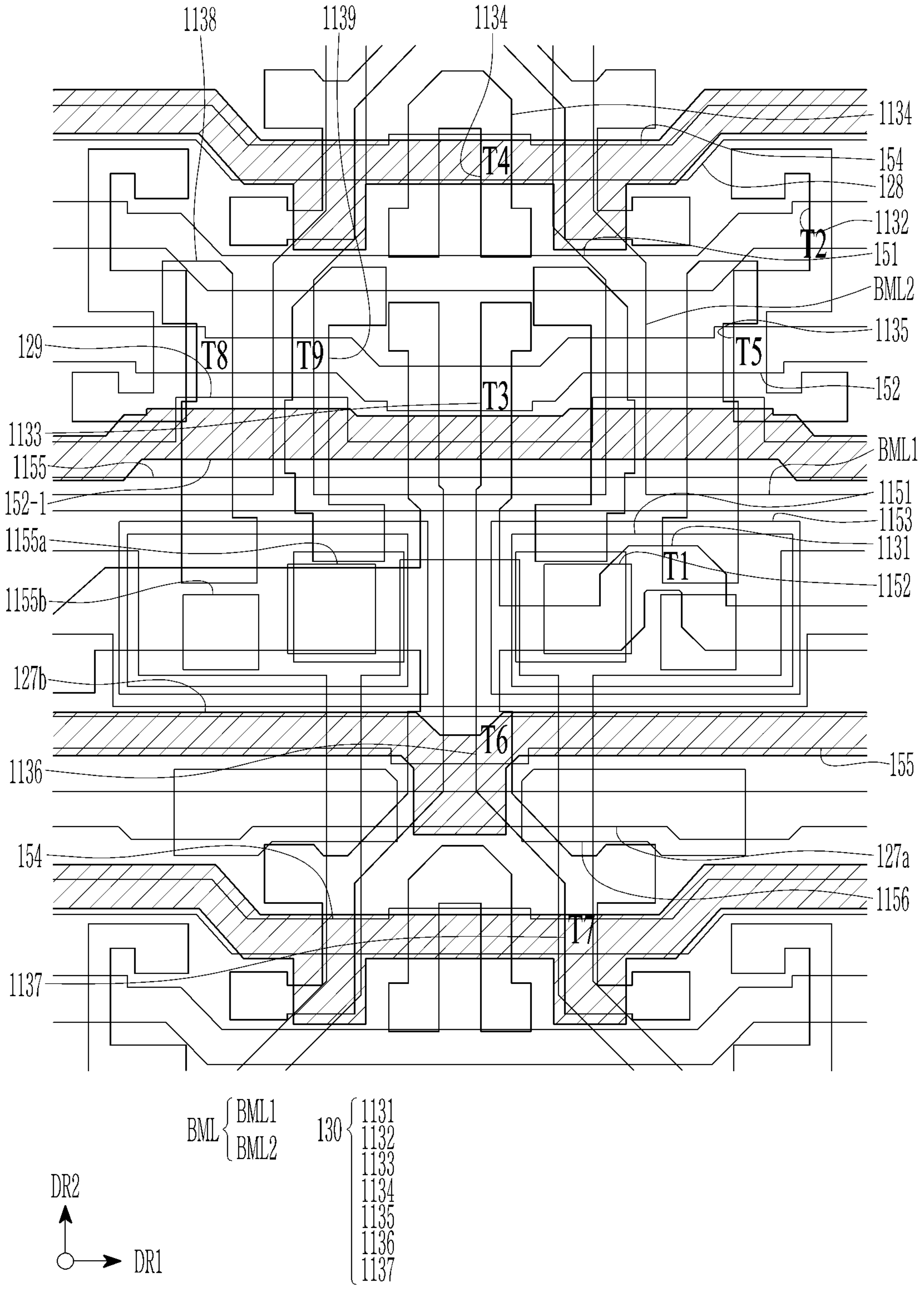

Referring to FIG. 13, a third gate conductive layer may be disposed on the third gate insulating layer GI3.

In the third gate conductive layer, a second-1 scan line 152-1 to which the second-1 scan signal GC2 may be applied may be positioned. The second-1 scan line 152-1 may include gate electrodes of the eighth transistor T8 and the ninth transistor T9. The second-1 scan line 152-1 may be integrally formed with the gate electrodes of the eighth transistor T8 and the ninth transistor T9.

The third gate conductive layer may further include an upper first initialization voltage line 127*b* and a second initialization voltage line 128. The second-1 scan line 152-1, the upper first initialization voltage line 127*b*, and the second initialization voltage line 128 may extend in a first direction (horizontal direction). The upper first initialization voltage line 127*b* may be connected to the lower first initialization voltage line 127*a* to receive a first initialization voltage. The second initialization voltage line 128 may receive a second initialization voltage.

The third gate conductive layer GAT3 may include a metal such as copper (Cu), molybdenum (Mo), aluminum (Al), titanium (Ti), and/or a metal alloy thereof, and it may be configured as a single layer or a multilayer.

After forming the third gate conductive layer GAT3, through plasma treatment or a doping process, a portion of the oxide semiconductor layer covered by the third gate conductive layer may be formed as a channel, and a portion of the oxide semiconductor layer not covered by the third gate conductive layer becomes conductive. The channel of the eighth transistor T8 may be positioned under the third gate conductive layer. The first region and the second region of the eighth transistor T8 may not overlap the third gate conductive layer. The channel of the ninth transistor T9 may be positioned under the third gate conductive layer. The first region and the second region of the ninth transistor T9 may not overlap the third gate conductive layer. A transistor including an oxide semiconductor layer may have characteristics of an n-type transistor.

Referring to FIG. 18, a third insulating layer IL3 may be positioned on the third gate conductive layer GAT3. The third insulating layer IL3 may have a single or multi-layered structure. The third insulating layer IL3 may include an inorganic insulating material such as a silicon nitride ($SiN_x$), a silicon oxide ($SiO_x$), and/or a silicon oxynitride ($SiO_xN_y$), and may include an organic material according to an embodiment.

Figure 14:
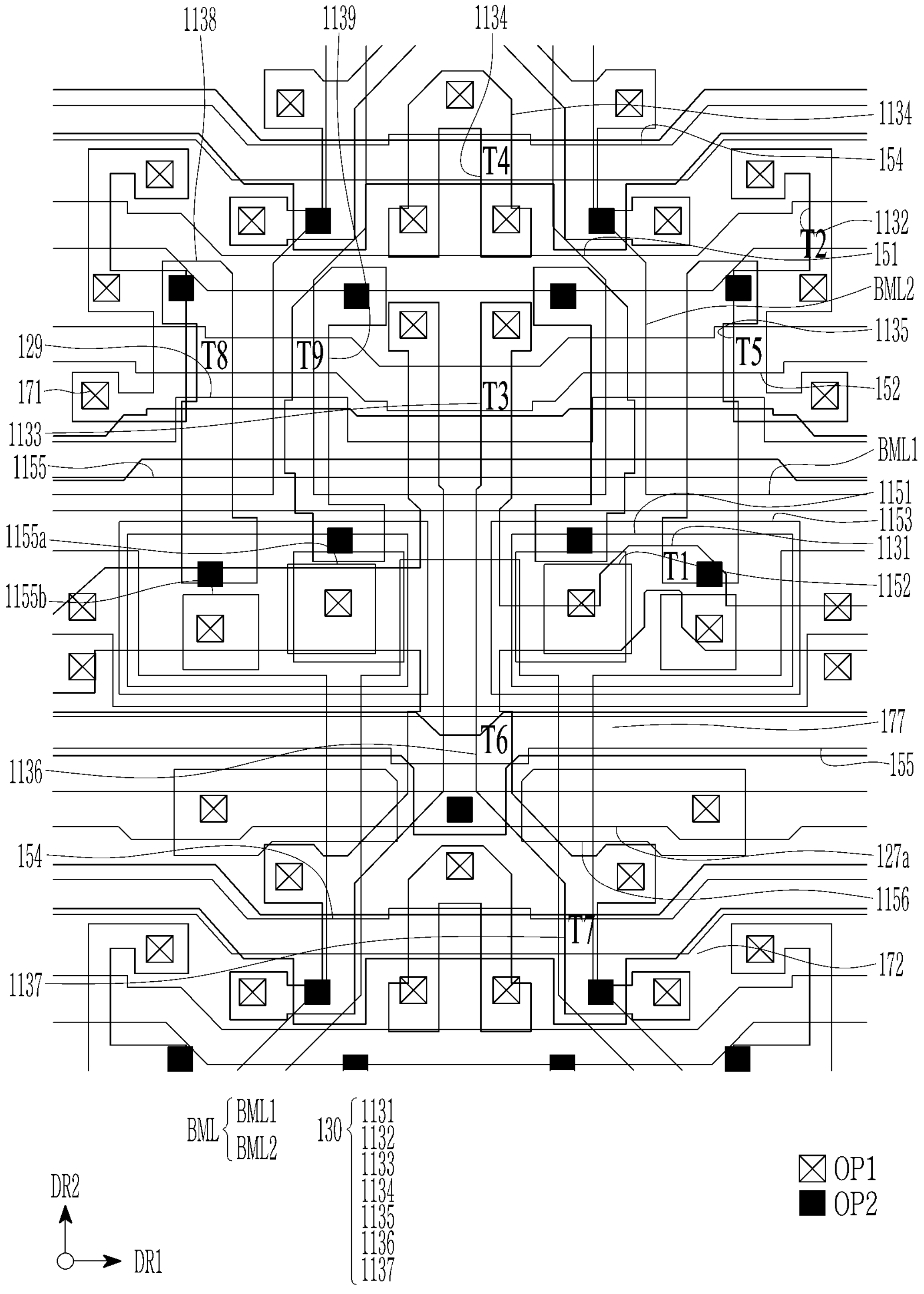

Referring to FIG. 14, two types of openings OP1 and OP2 may be formed in the third insulating layer IL3. The third openings OP1 and the fourth openings OP2 may be formed by using different masks.

For the third openings OP1, the first semiconductor layer 130, the first gate conductive layer, or the second gate conductive layer may be exposed by forming an opening in at least one of the third insulating layer IL3, the third gate insulating layer GI3, the second insulating layer IL2, the first insulating layer IL1, the second gate insulating layer GI2, and the first gate insulating layer GI2.

One of the third openings OP1 may overlap at least a portion of the gate electrode 1151 of the driving transistor T1, and may be formed on the third insulating layer IL3, the third gate insulating layer GI3, the second insulating layer IL2, the first insulating layer IL1, the second gate insulating layer GI2, and the second gate insulating layer GI1. One of the third openings OP1 may overlap the first opening 1152 of the first storage electrode 1153, and may be positioned inside the first opening 1152 of the first storage electrode 1153.

The fourth opening OP2 may form an opening in the third insulating layer IL3 and/or the third gate insulating layer GI3 and may expose the oxide semiconductor layer or the third gate conductive layer.

Figure 15:
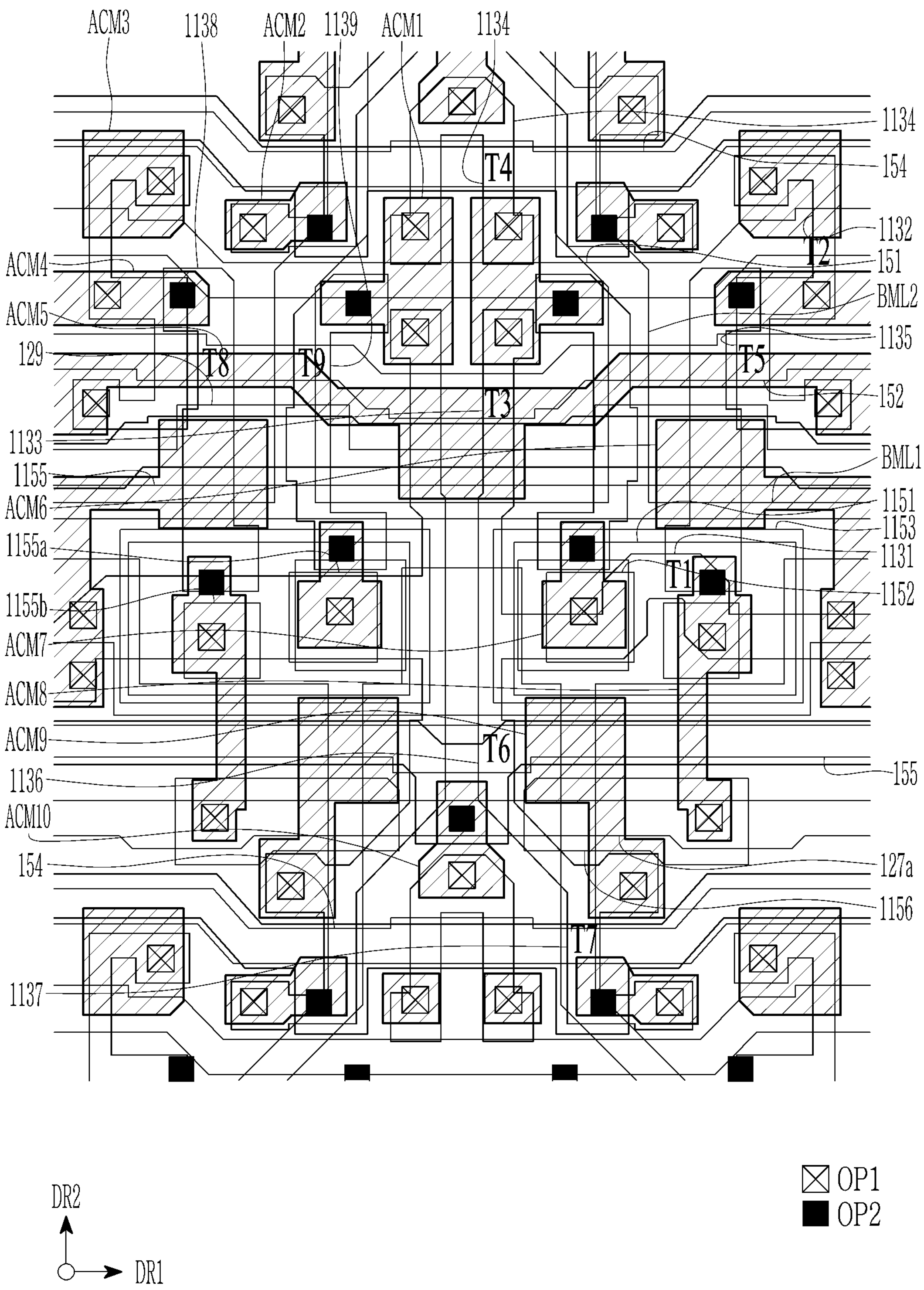

Referring to FIG. 15, a first data conductive layer including a first connection electrode ACM1 to a tenth connection electrode ACM10 may be disposed on the third insulating layer IL3.

The first connection electrode ACM1 may electrically connect the fourth transistor T4 and the third transistor T3 through the third opening OP1. The first connection electrode ACM1 may electrically connect the fourth transistor T4 and the ninth transistor T9 through the fourth opening OP2. The second connection electrode ACM2 may be connected to the seventh transistor T7 through the third opening OP1, and may be connected to the second initialization voltage line 128 through the fourth opening OP2. The second initialization voltage $V_{AINT}$ may be transferred to an electrode of the seventh transistor T7 through the second connection electrode ACM2. A third connection electrode ACM3 may be electrically connected to the second transistor T2 through the third opening OP1, and may be connected to the data line 171 through a fifth opening OP3 to be described later. The second transistor T2 may receive the data voltage $V_{DATA}$ through the third connection electrode ACM3.

The second transistor T2 and the eighth transistor T8 may be electrically connected through a fourth connection electrode ACM4. The fifth connection electrode ACM5 may extend substantially along the first direction DR1, and the reference voltage $V_{RFF}$ may be applied. The fifth connection electrode ACM5 may be electrically connected to the reference voltage line 174 through the third opening OP3, which will be described later.

A sixth connection electrode ACM6 may transfer the driving voltage ELVDD to the first transistor T1. A seventh connection electrode ACM7 may overlap the gate electrode 1151 of the driving transistor T1. A seventh connection electrode ACM7 may be connected to the gate electrode 1151 of the driving transistor T1 through the third opening OP1 and the first opening 1152 of the first storage electrode 1153. The seventh connection electrode ACM7 may electrically connect the gate electrode 1151 of the driving transistor T1 and the ninth transistor T9.

An eighth connection electrode ACM8 may be connected to a first end of the first storage electrode 1153 and a first electrode of the eighth transistor T8. The eighth connection electrode ACM8 may be electrically connected to one electrode 1156 forming the auxiliary capacitor Cb. A ninth connection electrode ACM9 may be connected to a first electrode of the sixth transistor T6, and may be electrically connected to a first electrode E1 through the third opening to be described later. A tenth connection electrode ACM10 may be electrically connected to the fourth transistor T4, and may be electrically connected to the first initialization voltage line.

A first data conductive layer may include a metal such as aluminum (Al), copper (Cu), molybdenum (Mo), titanium (Ti), and/or a metal alloy thereof, and may be configured as a single layer or a multiple layer.

Referring to FIG. 18, a fourth insulating layer IL4 may be positioned on the first data conductive layer SD1. The fourth insulating layer IL4 may be an organic insulating layer including an organic material, and may include at least one material of a polyimide, a polyamide, an acrylic resin, benzocyclobutene, and a phenol resin as an organic material.

Figure 16:
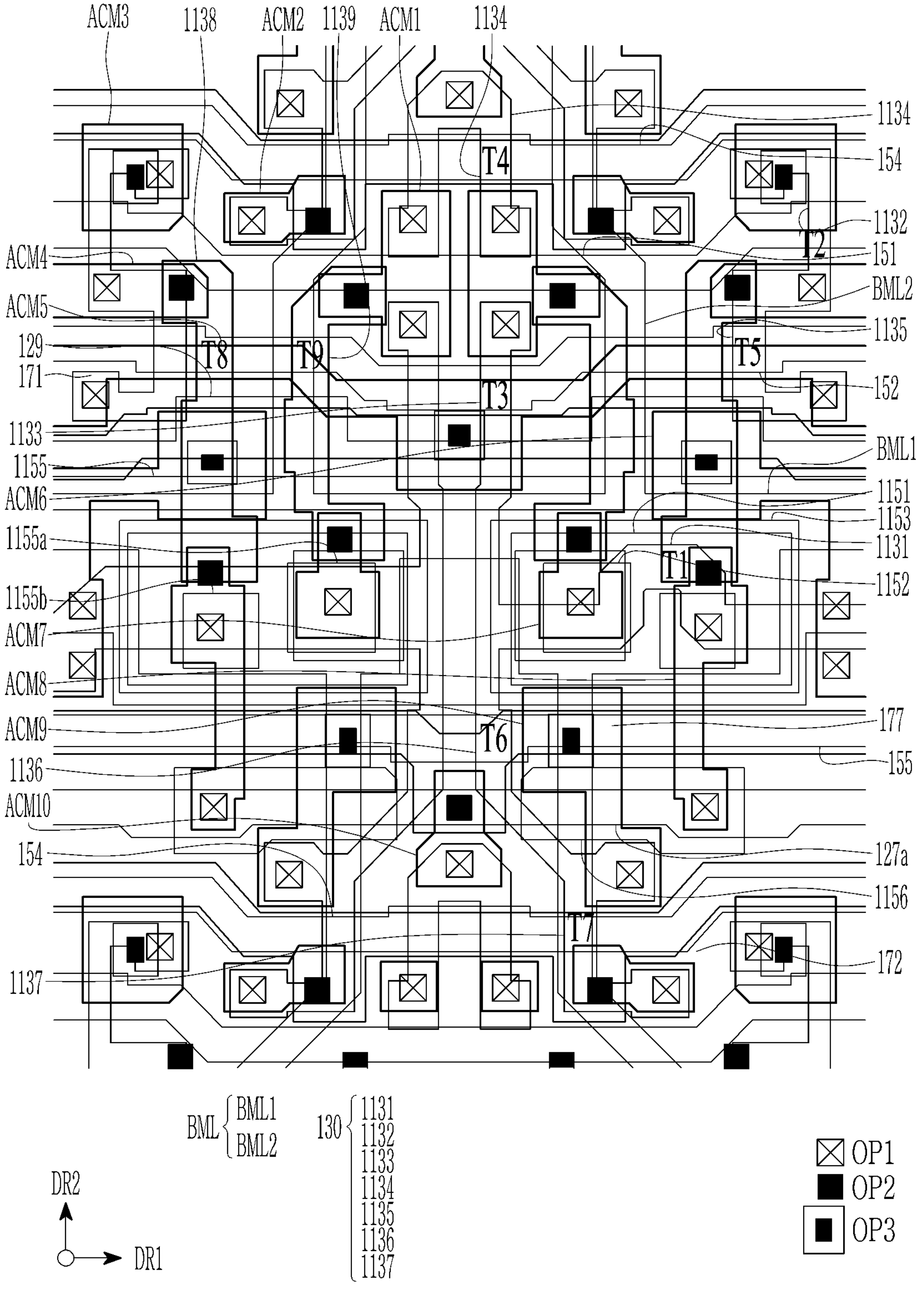

As illustrated in FIG. 16, the third opening OP3 may overlap the data line 171, the driving voltage line 172, the reference voltage line 174, and an anode connecting member 177 in a first data conductive layer to be described later to expose each of them.

Figure 17:
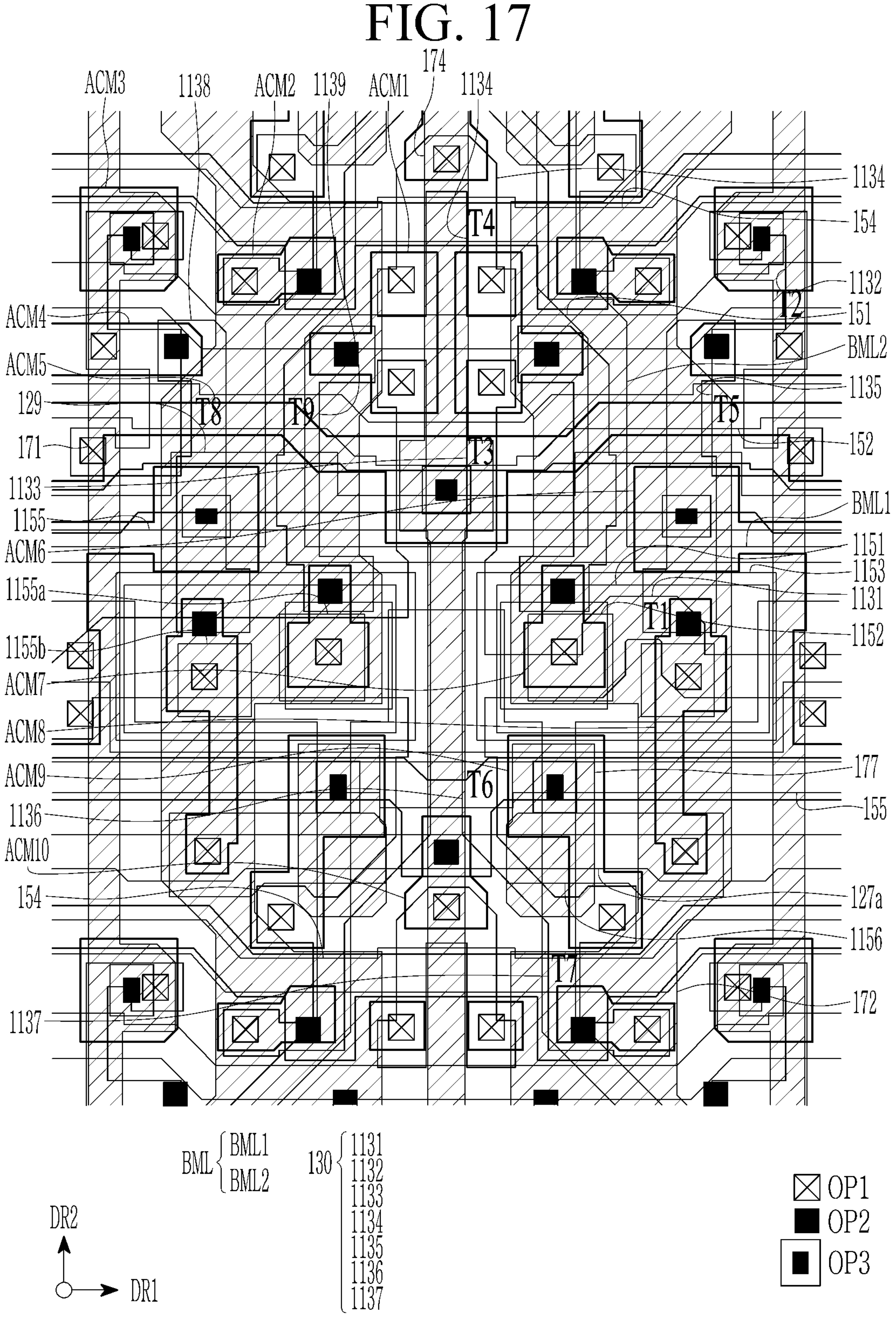
Figure 18:
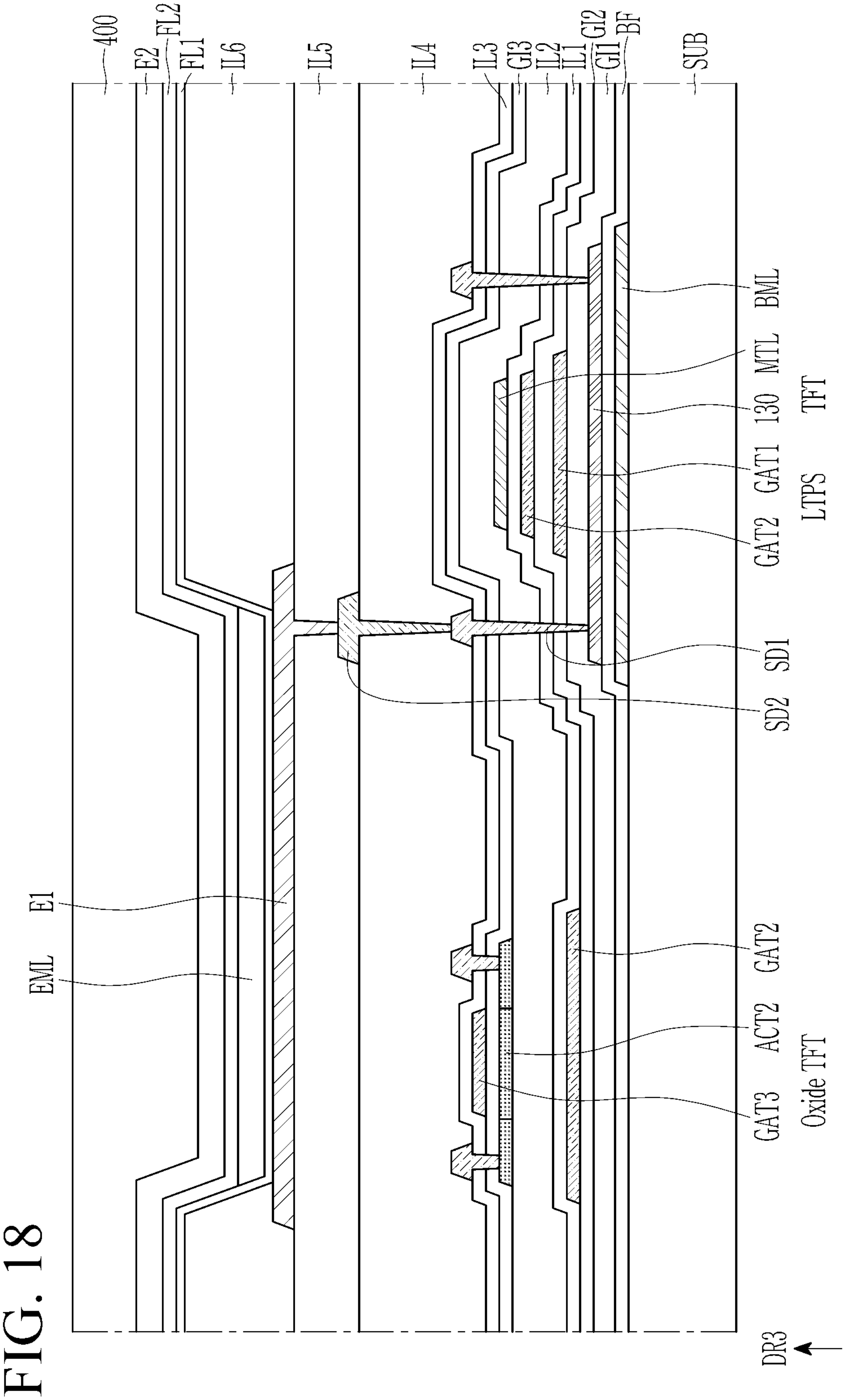
FIG. 18 illustrates a schematic cross-section of a display panel layer.

Referring to FIG. 17, a second data conductive layer including the data line 171, the driving voltage line 172, the reference voltage line 174, and the anode connecting member 177 may be positioned on the fourth insulating layer IL4.

The data line 171, the driving voltage line 172, and the reference voltage line 174 may extend in a substantially vertical direction (the second direction DR2).

The data line 171 may be connected to the connecting member ACM3 of the first data conductive layer through the third opening OP3, and accordingly, it may be connected to the second transistor T2.

The driving voltage line 172 may be connected to a sixth connection member ACM6 of the first data conductive layer through the third opening OP3. Accordingly, it may be electrically connected to the first transistor T1.

The driving voltage line 172 may be positioned between the data line 171 and the reference voltage line 174, and may be formed in a wide shape in a portion where another second data conductive layer may not be positioned. The driving voltage line 172 may be formed to be wide in order to planarize an anode positioned thereabove.

The reference voltage line 174 may be connected to the fifth connection member ACM5 of the first data conductive layer through the third opening OP3. Accordingly, the reference voltage $V_{REF}$ may be transferred to the fifth transistor T5 through the connection member ACM5.

The connecting member 177 may be connected to a connecting member ACM9 of the first data conductive layer through the third opening OP3, and accordingly, it may be connected to the sixth transistor T6.

A second data conductive layer may include a metal such as aluminum (Al), copper (Cu), molybdenum (Mo), titanium (Ti), and/or a metal alloy thereof, and may be configured as a single layer or a multiple layer.

Referring to FIG. 18, a fifth insulating layer IL5 may be disposed on a second data conductive layer SD2. A first electrode E1 may be positioned on the fifth insulating layer IL5. The first electrode E1 may receive a current from the pixel circuit unit through an anode connecting opening.

A partition wall or bank IL6 may be positioned on the first electrode E1. The bank IL6 having an opening exposing the first electrode E1 and covering at least a portion of the first electrode E1 may be positioned on the first electrode E1. The bank IL6 may be a black pixel defining layer formed of an organic material having a black color so that light applied from the outside may not be reflected back to the outside, and may be formed of a transparent organic material according to an embodiment. Therefore, according to an embodiment, the bank IL6 may include a negative type of black organic material, and may include a black pigment.

Although not illustrated in the specification, a spacer may be positioned on the bank IL6. Unlike the bank IL6, the spacer may be formed of a transparent organic insulating material. According to an embodiment, the spacer may be formed of a positive type of transparent organic material.

Functional layers FL1 and FL2 and the second electrode E2 may be sequentially formed on the first electrode E1 and the bank IL6. An emission layer EML may be disposed between the functional layers FL1 and FL2, and may be disposed only within the opening of the bank IL6. Hereinafter, the functional layers FL1 and FL2 and the emission layer EML may be collectively referred to as an intermediate layer. The functional layers FL1 and FL2 may include a first functional layer FL1 including at least one of a hole transport layer and a hole injection layer, and a second functional layer FL2 including at least one of an electron transport layer and an electron injection layer.

An encapsulation layer 400 may be disposed on the second electrode E2. The encapsulation layer 400 includes at least one inorganic layer and at least one organic layer, and may have a triple-layer structure including a first inorganic encapsulation layer, an organic encapsulation layer, and a second inorganic encapsulation layer according to an embodiment. The encapsulation layer 400 may be for protecting the emission layer EML from moisture or oxygen that may be introduced from the outside. According to an embodiment, the encapsulation layer 400 may include a structure in which an inorganic layer and an organic layer are further sequentially stacked on each other.

Figure 19:
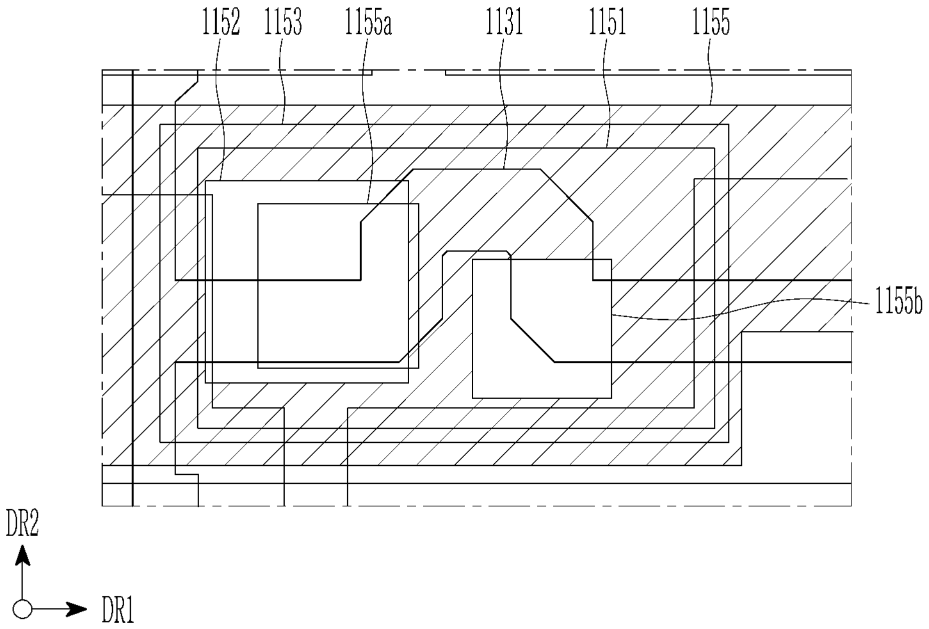
FIG. 19 illustrates an enlarged schematic view showing only a portion of a display panel layer.

Hereinafter, a partial structure of a display panel according to an embodiment will be described in more detail with reference to FIG. 19 and FIG. 20. FIG. 19 illustrates an enlarged schematic view showing only a portion of a display panel layer, and FIG. 20 illustrates a schematic cross-sectional view showing only a portion of a display panel layer.

Figure 20:
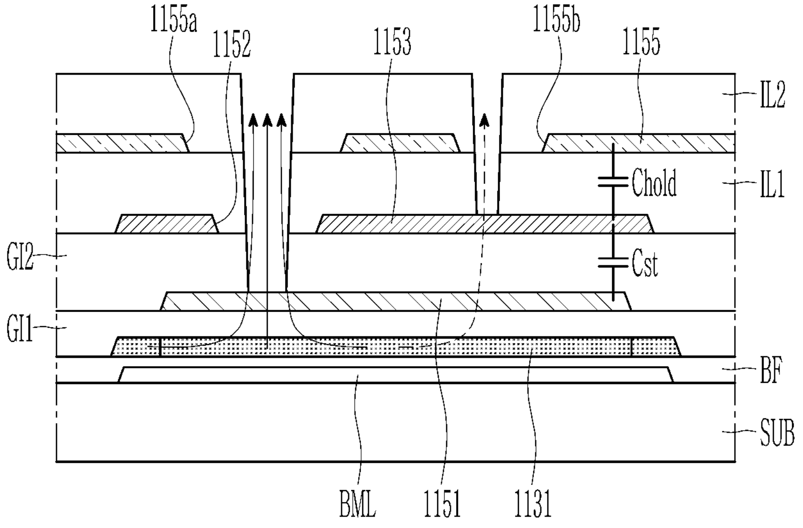
FIG. 20 illustrates a schematic cross-sectional view showing only a portion of a display panel layer.

FIG. 19 and FIG. 20 each illustrate only the lower metal layer, the first semiconductor layer, the first gate conductive layer, the second gate conductive layer, and the first metal layer among the above-described components. A description of the same or similar constituent elements as those described above will be omitted.

The first storage electrode 1153 according to an embodiment may overlap the gate electrode 1151 of the driving transistor T1 to constitute the storage capacitor Cst. The first storage electrode 1153 may include a first opening 1152 overlapping the gate electrode 1151.

The first electrode 1155 including the first metal layer according to an embodiment may overlap the first storage electrode 1153 and the gate electrode 1151 of the driving transistor T1. The first electrode 1155 may receive the driving voltage ELVDD, and may form the first storage electrode 1153 and the hold capacitor Chold.

According to an embodiment, the hold capacitor Chold and the hold capacitor Cst may overlap in a direction that is perpendicular to the substrate SUB. As the hold capacitor Chold and the hold capacitor Cst vertically overlap, a degree of freedom in circuit configuration may be secured while providing a high-resolution display device.

The first opening 1152 of the first storage electrode 1153 and the second opening 1155*a* of the first electrode 1155 may overlap each other. A planar size of the first opening 1152 of the first storage electrode 1153 may be smaller than that of the second opening 1155*a* of the first electrode 1155, but the disclosure is not limited thereto. The third opening 1155*b* of the first electrode 1155 may overlap the first storage electrode 1153, and may be spaced apart from the first opening 1152 of the first storage electrode 1153.

Since it is possible to provide a path (indicated by an arrow in FIG. 20) for discharging hydrogen generated during a manufacturing process through the first opening 1152 of the first storage electrode 1153 and the second opening 1155*a* of the first electrode 1155, a driving range (DR range) of the gate voltage may be increased. Accordingly, reliability and display quality of the display device may be improved. Since the path for discharging hydrogen may be provided through a process of forming the third opening OP1, the manufacturing process may be simplified.

While this disclosure has been described in connection with what is considered to be practical embodiments, it is to be understood that the disclosure is not limited to the disclosed embodiments, but, on the contrary, is intended to cover various modifications and equivalent arrangements included within the spirit and scope of the disclosure.

What is claimed is:

1. A display device comprising:

a substrate;

a first semiconductor layer disposed on the substrate;

a first gate electrode disposed on the first semiconductor layer;

a first storage electrode overlapping at least a portion of the first gate electrode and forming a first capacitor with the first gate electrode; and a first electrode disposed on the first storage electrode and forming a second capacitor together with the first storage electrode, wherein;

the first storage electrode includes a first opening, the first electrode includes a second opening, the first opening and the second opening overlap each other, the first electrode further includes a third opening, the third opening overlaps the first storage electrode, wherein the first electrode receives a driving voltage, and an area of the second opening is larger than an area of the third opening in a plan view.

2. The display device of claim 1, wherein the first capacitor is a storage capacitor, the second capacitor is a hold capacitor, and the first capacitor and the second capacitor overlap in a direction that is perpendicular to a surface of the substrate.

3. The display device of claim 1, wherein the first semiconductor layer includes a first transistor, and the first transistor overlaps at least portions of the first gate electrode, the first storage electrode, and the first electrode.

4. The display device of claim 3, wherein the first transistor is a driving transistor.

5. The display device of claim 1, wherein a size of the second opening is greater than a size of the first opening.

6. The display device of claim 3, wherein the display device further includes a first data conductive layer disposed on the first electrode, and a portion of the first data conductive layer is electrically connected to the first gate electrode.

7. The display device of claim 6, wherein the display device further includes:

a first gate insulating layer disposed between the first semiconductor layer and the first gate electrode;

a second gate insulating layer disposed between the first gate electrode and the first storage electrode;

a first insulating layer disposed between the first storage electrode and the first electrode; and a second insulating layer disposed between the first electrode and the first data conductive layer, wherein a fourth opening passing through the first opening and the second opening is formed in the second insulating layer, the first insulating layer, and the second gate insulating layer.

8. The display device of claim 7, wherein the display device further includes:

a second semiconductor layer disposed on the second insulating layer;

a third gate conductive layer disposed on the second semiconductor layer; and a second data conductive layer disposed on the first data conductive layer.

9. The display device of claim 8, wherein the display device further includes second to ninth transistors.

10. The display device of claim 1, wherein each of the second opening and the third opening is entirely bounded by the first electrode in the plan view.

11. The display device of claim 1, wherein:

the first electrode is connected to receive the driving voltage, and the second opening overlaps the first opening in a plan view.

12. A display device comprising:

a substrate;

a first transistor disposed on the substrate;

a first gate electrode disposed on the first transistor;

a first storage electrode overlapping at least a portion of the first gate electrode and forming a first capacitor with the first gate electrode; and a first electrode disposed on the first storage electrode and forming a second capacitor together with the first storage electrode, wherein;

the first capacitor and the second capacitor overlap in a direction that is perpendicular to a surface of the substrate, the first storage electrode includes a first opening, the first electrode includes a second opening, at least portions of the first opening and the second opening overlap each other, the first electrode further includes a third opening, the third opening overlaps the first storage electrode, wherein the first electrode receives a driving voltage, and an area of the second opening is larger than an area of the third opening in a plan view.

13. The display device of claim 12, wherein the first capacitor is a storage capacitor, and the second capacitor is a hold capacitor.

14. The display device of claim 12, wherein the first transistor is a driving transistor, and the first transistor overlaps the first storage electrode and the first electrode.

15. The display device of claim 12, wherein a size of the second opening is greater than a size of the first opening.

16. The display device of claim 14, wherein the display device further includes a first data conductive layer disposed on the first electrode, and a portion of the first data conductive layer is electrically connected to the first gate electrode.

17. The display device of claim 16, wherein the display device further includes:

a first gate insulating layer disposed between the first transistor and the first gate electrode;

a second gate insulating layer disposed between the first gate electrode and the first storage electrode;

a first insulating layer disposed between the first storage electrode and the first electrode; and a second insulating layer disposed between the first electrode and the first data conductive layer, wherein a fourth opening passing through the first opening and the second opening is formed in the second insulating layer, the first insulating layer, and the second gate insulating layer.

18. The display device of claim 17, wherein the display device includes:

a second semiconductor layer disposed on the second insulating layer;

a third gate conductive layer disposed on the second semiconductor layer; and a second data conductive layer disposed on the first data conductive layer.

19. The display device of claim 17, wherein the display device further includes second to ninth transistors.

20. The display device of claim 19, wherein at least some of the first to ninth transistors are p-type transistors, and the rest of the first to ninth transistors are n-type transistors.

* * * * *